US012707912B2

(12) United States Patent
Shariff et al.

(10) Patent No.: US 12,707,912 B2
(45) Date of Patent: Aug. 11, 2026

(54) PLASMA DICED WAFERS AND METHODS THEREOF

(71) Applicant: UTAC Headquarters Pte. Ltd., Singapore (SG)

(72) Inventors: Dzafir Bin Mohd Shariff, Singapore (SG); Enrique E. Sarile, Jr., Singapore (SG); Jackson Fernandez Rosario, Singapore (SG); Ronnie M. De Villa, Singapore (SG); Chan Loong Neo, Singapore (SG); Il Kwon Shim, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 666 days.

(21) Appl. No.: 18/175,124

(22) Filed: Feb. 27, 2023

(65) Prior Publication Data

US 2023/0274979 A1 Aug. 31, 2023

Related U.S. Application Data

(63) Continuation-in-part of application No. 18/072,730, filed on Dec. 1, 2022, and a continuation-in-part of application No. 18/056,726, filed on Nov. 18, 2022.

(60) Provisional application No. 63/325,619, filed on Mar. 31, 2022, provisional application No. 63/315,012, filed on Feb. 28, 2022.

(51) Int. Cl.

| | |
|---|---|
| ***H10P 54/00*** | (2026.01) |
| ***H10D 62/10*** | (2025.01) |
| ***H10P 72/70*** | (2026.01) |
| *H10P 34/42* | (2026.01) |
| *H10P 50/24* | (2026.01) |
| *H10P 52/00* | (2026.01) |

(52) U.S. Cl.

CPC ........... *H10P 54/00* (2026.01); *H10D 62/117* (2025.01); *H10P 72/7402* (2026.01); *H10P 34/42* (2026.01); *H10P 50/242* (2026.01); *H10P 52/00* (2026.01); *H10P 72/7416* (2026.01)

(58) Field of Classification Search

CPC .... H01L 21/78; H01L 21/6836; H01L 21/268

See application file for complete search history.

(56) References Cited

U.S. PATENT DOCUMENTS

2016/0211178 A1* 7/2016 Brunnbauer .......... H01L 21/268
2018/0308800 A1* 10/2018 Tsai ...................... H01L 21/568
2019/0206676 A1* 7/2019 Mou ................. H01L 21/02063

FOREIGN PATENT DOCUMENTS

TW 201448029 A * 12/2014 ............ H10D 84/01

* cited by examiner

*Primary Examiner* — Mohammad M Choudhry
(74) *Attorney, Agent, or Firm* — HORIZON IP PTE LTD

(57) ABSTRACT

Reliable plasma dicing of a processed wafer with a die attach film (DAF) attached to the bottom wafer surface to singulate it into individual dies is disclosed. Laser processing is employed to form mask openings in a passivation stack of a processed wafer to serve as a dicing mask. Laser processing is employed to form a modified layer with cracks on a bottom portion of the wafer. Plasma dicing partially dices the processed wafer to about the modified layer. The dicing tape is expanded laterally away from the center of the partially diced processed wafer, singulating it into individual dies. Singulation of the partially plasma diced processed wafer is facilitated by the modified layer.

16 Claims, 29 Drawing Sheets

302

450
440
480
418
416
417
400
410

780
740
750
760
790
794
716
717
710B
710
700

PLASMA DICED WAFERS AND METHODS THEREOF

CROSS-REFERENCE TO RELATED APPLICATION

This application is a continuation-in-part of the U.S. Patent Application filed on Dec. 1, 2022, with application Ser. No. 18/072,730, titled "PLASMA DICED WAFERS AND METHODS THEREOF" and U.S. Patent Application filed on Nov. 18, 2022, with application Ser. No. 18/056,726, titled "PLASMA DICED WAFERS AND METHODS THEREOF". This application also claims the benefit of U.S. Provisional Application No. 63/315,012, filed on Feb. 28, 2022, and U.S. Provisional Application Ser. No. 63/325,619, filed on Mar. 31, 2022. All applications are incorporated by reference in their entirety for all purposes.

FIELD OF THE INVENTION

The present disclosure generally relates to plasma dicing of semiconductor wafers. More specifically, the present disclosure is directed to reliable dies from plasma dicing.

BACKGROUND

In semiconductor processing, a wafer is processed to form a plurality of devices thereon. After the devices are formed, the wafer is diced to separate the devices into individual dies. Conventional techniques for dicing employ the use of a dicing saw. The saw cuts the wafer along the x-direction and the y-direction saw lines, one at a time, to separate the wafer into individual dies. Sawing, however, takes time, which slows down the processing throughput. In addition, mechanical sawing causes vibration when cutting the wafer. The vibration may cause cracks in the dies, such as the back-end dielectric, which may impact yields negatively.

To combat the issues of sawing, plasma dicing has been investigated. Plasma dicing entails mounting a wafer onto a wafer ring and inserting the wafer ring with the wafer into a plasma chamber for etching. Unlike mechanical sawing, the plasma etch process singulates the wafer into individual dies in a single plasma etch step without any vibration issues. This significantly improves throughput as well as avoids reliability issues due to cracking.

The present disclosure is directed to reliable plasma dicing of wafers for singulating it into individual dies.

SUMMARY

Reliable plasma dicing of wafers is disclosed. In one embodiment, the present disclosure is related to a device. The device includes a die substrate with active and inactive major die substrate surfaces. The active die substrate surface includes circuit components of the device. A BEOL dielectric is disposed on the active major surface with the circuit components. The BEOL dielectric includes interconnects interconnecting the circuit components. A passivation layer disposed on a top surface of the BEOL dielectric. A die attach film is attached to the inactive die substrate surface. Die side surfaces of the die includes substrate side surfaces, die attach film side surfaces, BEOL dielectric side surfaces and passivation side surfaces. A die sidewall profile of the die side surfaces includes an upper die sidewall portion and a lower die sidewall portion. The upper die sidewall portion includes a passivation side surface and a BEOL side surface and an upper portion of the die substrate side surface. The surfaces of the upper sidewall portion are substantially aligned. The lower die sidewall portion includes a lower portion of the die substrate side surface, a die attach film side surface and a foot portion which includes the lower portion of the die side surface and die attach film side surface. The foot portion extends outwardly from the upper sidewall portion. The surfaces of the lower sidewall portion are substantially aligned.

In another embodiment, a method for forming devices is disclosed. The method includes providing a processed wafer with a plurality of dies formed thereon. The processed wafer includes a wafer with active and inactive major wafer surfaces. The active wafer includes circuit components of the devices. A BEOL dielectric disposed on the active major wafer surface with the circuit components. The BEOL dielectric includes interconnects interconnecting the circuit components. A passivation layer disposed on a top surface of the BEOL dielectric. Dicing channels separating the plurality dies in the x and y directions. A die attach film is attached to the inactive surface of the wafer. Stealth dicing is performed to form a modified layer with cracks in a bottom portion of the wafer. The passivation layer is patterned to expose the dicing channels of the processed wafer. Plasma dicing is performed to partially diced the processed wafer using the patterned passivation layer as a plasma dicing mask. The plasma dicing removes exposed dicing channels of the processed wafer until it reaches a lower portion of the wafer, leaving the lower portion of the wafer and die attach film remaining. A singulation process is performed using lateral force to break the lower portion of the wafer and die attach film to singulate the processed wafer into individual devices. The modified layer facilitates in singulating the processed wafer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily drawn to scale, with emphasis instead generally being placed upon illustrating the principles of the invention. In the following description, various embodiments of the present invention are described with reference to the following drawings, in which.

DETAILED DESCRIPTION

Embodiments relate to plasma dicing of wafers into individual dies. The plasma dicing, according to various embodiments, results in reliable plasma-diced dies. The present plasma wafer dicing avoids notching on the backside of the wafer or dies, improving process reliability and yields. In addition, the plasma diced dies include a die attach film on the inactive surface, improving die strength, stability, and shear, resulting in improved reliability of the dies.

Figure 1A:
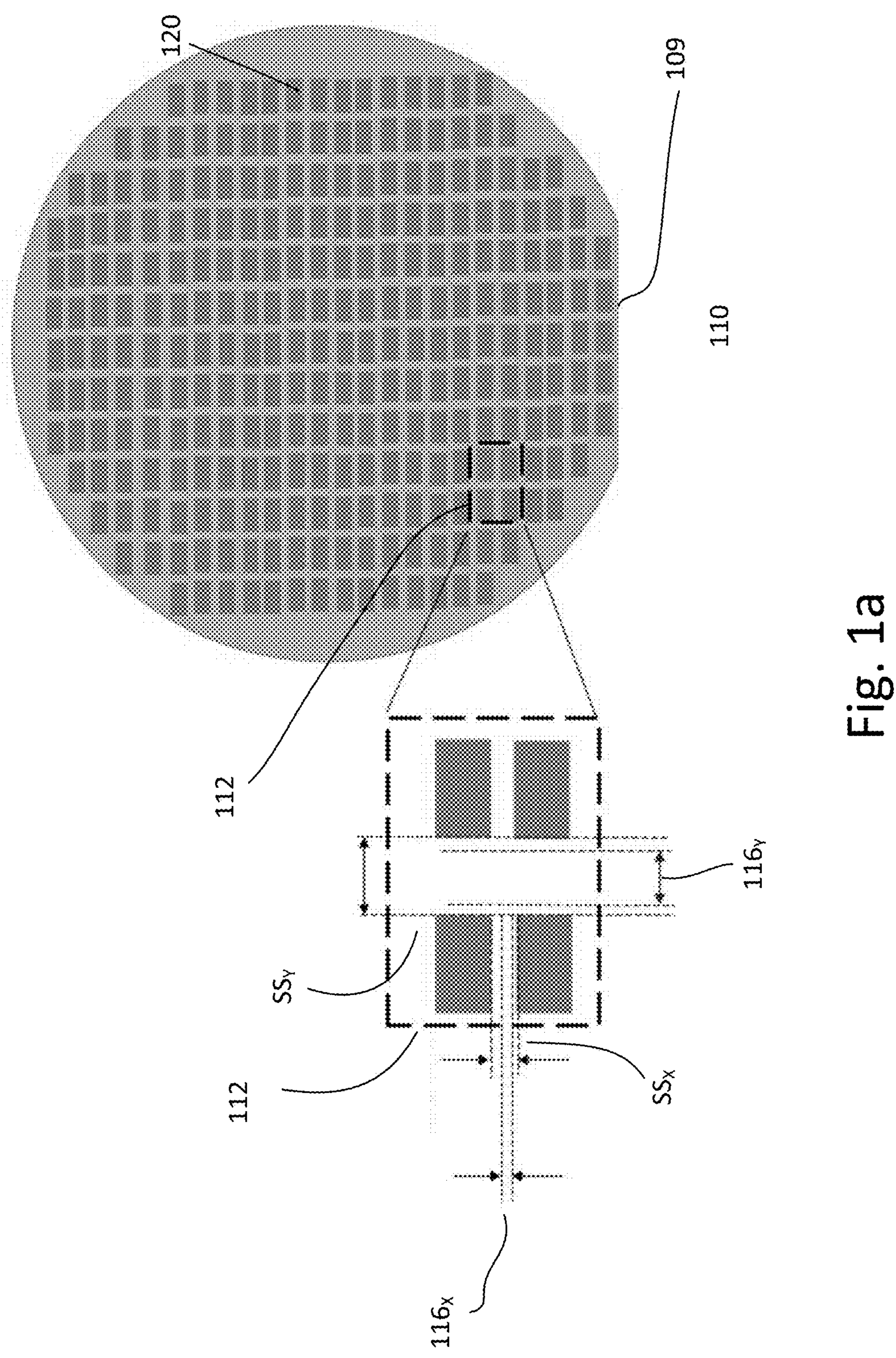
FIG. 1*a* shows a simplified top view of an embodiment of a processed wafer.

FIG. 1*a* shows a top view of an embodiment of a wafer 110. The wafer, as shown, is a semiconductor wafer with first and second major surfaces. On a first or active (frontside) surface, the wafer is processed to form a plurality of dies 120. The dies, for example, are arranged in rows (x-direction) and columns (y-direction). Separating the rows and columns of dies are first and second saw streets or dicing lines. For example, x-direction dicing lines $SS_x$ and y-direction dicing lines $SS_y$ separate the rows and columns of dies on the wafer. As shown, the wafer includes a notch 109. The notch, for example, is a flat surface and serves to orient the wafer. Other types of notches for the wafer for orienting the wafer may also be useful.

A detailed portion 112 of the wafer which includes adjacent dies in the x-direction and y-direction is shown. As shown, a saw street includes a kerf region within the saw street. For example, an x-direction saw street $SS_x$ includes an x-direction kerf region $\mathbf{116}_x$ disposed within the saw street. Likewise, a y-direction saw street $SS_y$ includes a y-direction kerf region 116*y* within the saw street. In one embodiment, the kerf region may be about 70 to 80% of the saw street width. Other kerf region widths with respect to the width of the saw street may also be useful.

As shown, the saw streets are defined by the edges of the dies in adjacent rows and columns. A kerf region, as shown, is disposed within the saw streets. Typically, test circuity is disposed within the kerf region for testing the dies on the wafer. During plasma dicing, the kerf region is removed. For example, the gap regions between the kerf regions and saw streets remain after plasma dicing. Other configurations of the saw streets and kerf regions may also be useful.

Figure 1B:
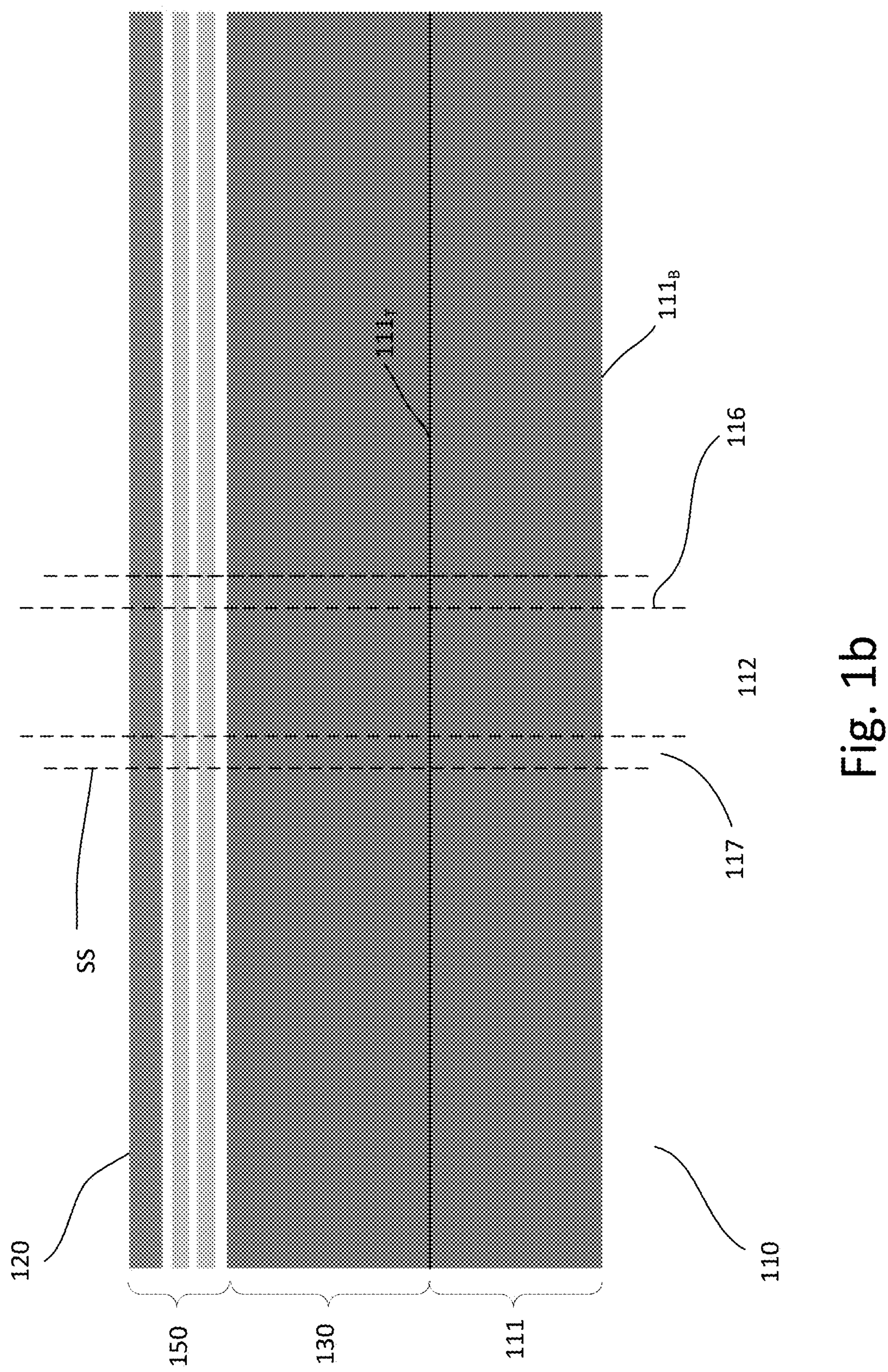
FIG. 1*b* shows a simplified cross-sectional view of a portion of a processed wafer which includes a saw street between two adjacent dies.

FIG. 1*b* shows a simplified cross-sectional view of a portion 112 of a processed wafer 110 which includes a saw street SS between two adjacent dies 120 of a row or a column. As shown, a wafer 111 serves as a substrate for processed dies 120. In one embodiment, the wafer is processed to form dies in parallel separated by orthogonal saw streets SS in the x-direction and y-direction. As shown, between a saw street SS is the kerf region 116. Gap regions 117 exist between a saw street and a kerf region.

In general, the fabrication of devices may involve the formation of features on a wafer that makes up circuit components, such as transistors, resistors, capacitors as well as other circuit components. The components are interconnected, enabling the device to perform the desired functions. To form the features and interconnections, layers are repeatedly deposited on the wafer and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes.

In one embodiment, features corresponding to the circuit components are formed in, on or above a major surface of the wafer. The surface of the wafer may be referred to as an active or top surface $\mathbf{111}_T$ of the wafer. For example, doped regions serving as wells, S/D contacts and well contacts may be formed by ion implantation processes in the substrate while other features, such as gates, capacitors, resistors, isolation regions and other components, may be formed on and above the surface of the substrate. The opposing surface of the active surface may be referred to as an inactive or bottom surface $\mathbf{111}_B$.

A back-end-of-line dielectric (BEOL) 130 may be formed on the substrate over the circuit components. The BEOL dielectric layer includes a pre-metal interlayer dielectric (ILD) layer disposed over the circuit components and a plurality of intermetal dielectric (IMD) layers disposed over the pre-metal ILD layer. The number of IMD layers may be depending on the CMOS process or technology.

The pre-metal ILD layer includes pre-metal contacts which are connected to contact regions of the components. For example, the pre-metal contacts are connected to S/D regions, transistor gates and well contacts. The pre-metal contacts, for example, may be tungsten (W) contacts. Other types of contacts may also be useful. The pre-metal ILD layer may be formed from multiple dielectric layers. Various dielectric materials, such as silicon oxide ($SiO_2$), may be used to form the pre-metal ILD layer.

As for an IMD layer, it includes a metal dielectric layer below a via dielectric layer. The dielectric layers of the IMD layer may be $SiO_2$. Other types of dielectric materials or combinations of dielectric materials or layers may also be useful to form the IMD layer. The metal level includes metal lines and the via level includes via contacts. The uppermost metal level may serve as a pad level in which bond pads for external connections to the dies are disposed. The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process. Other configurations of the IMD layers may also be useful.

Above the BEOL dielectric is a passivation stack 150. The passivation stack includes multiple dielectric passivation layers. For example, the passivation layer may include silicon oxide, silicon nitride and/or silicon oxynitride layers. The uppermost layer may be silicon nitride. For example, the uppermost passivation layer can be etched selectively from the BEOL dielectric. Other configurations of the passivation layer or stack may also be useful. The passivation layer or stack protects the die. Passivation stack may also be used to refer to a passivation layer. Bond openings may be formed in the passivation stack to expose the bond pads. Bond openings facilitate interconnecting the die and the package substrate during the package assembly process. In one embodiment, the passivation stack is patterned to define openings for plasma dicing of the wafer to singulate it into individual dies. The openings may be formed by laser patterning or etching. For example, a laser grooving process is employed to form the openings in the passivation stack. In one embodiment, the openings correspond to the kerf region within the saw streets. For example, the plasma dicing process removes the kerf regions, leaving the gap regions remaining.

Figure 2A:
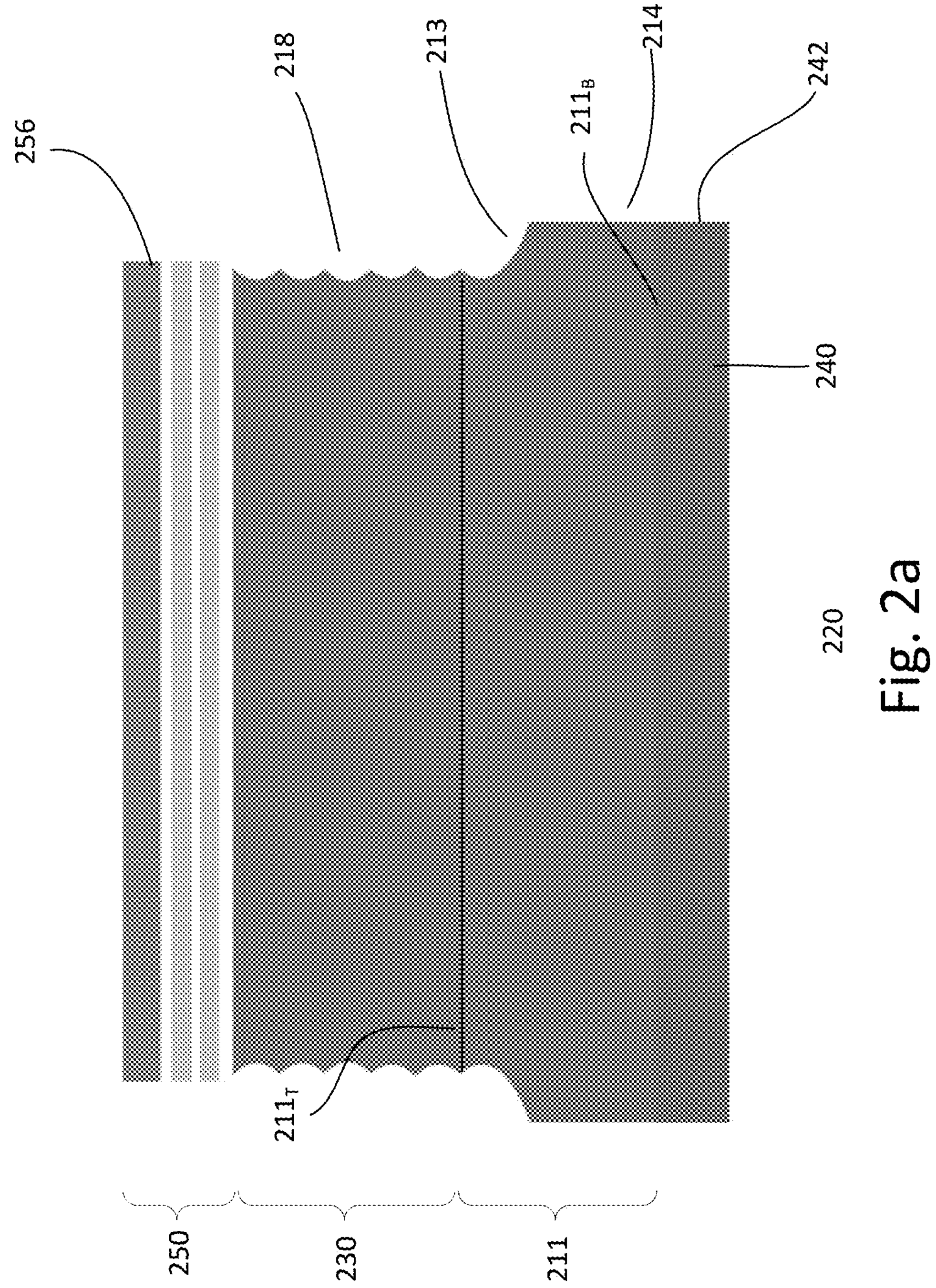
FIG. 2*a* shows a simplified cross-sectional view of an embodiment of a plasma diced die.

FIG. 2a shows a simplified cross-sectional view of an embodiment of a plasma diced die 220. The cross-section view may be along the x-direction or the y-direction. The die is preferably rectangular-shaped. Other shaped die may also be useful. The die includes a substrate 211 with circuit components. The substrate is a part of the wafer before singulation. Above the top surface $\mathbf{211}_T$ of the substrate is a BEOL dielectric 230 with interconnections for the circuit components. For example, the BEOL dielectric includes an ILD layer with multiple IMD layers thereover. An uppermost metal level dielectric of the IMD layer may serve as a pad level with bond pads.

A passivation stack 250 is disposed over the top of the BEOL dielectric. For example, the passivation stack is disposed over the pad level with bond pads. In one embodiment, the passivation stack includes multiple dielectric passivation layers. For example, the passivation layer may include silicon oxide, silicon nitride and/or silicon oxynitride layers. Other configurations of passivation stacks may also be useful. The passivation stack may include pad openings (not shown) to expose the bond pads for external connections to the internal circuit components of the die. For example, power and input/output (I/O) connections are provided via the bond pads.

In one embodiment, the passivation stack includes flat sidewalls 256. The flat sidewalls form planar surfaces. For example, the passivation stack includes 2 pairs of opposing flat sidewalls. In one embodiment, the flat sidewalls are in the vertical direction. For example, the vertical sidewall walls are orthogonal to the major surfaces of the wafer or substrate of the die, such as the top or bottom substrate surface. The vertical sidewalls are formed by the mask opening process to define the plasma dicing mask. In one embodiment, the vertical sidewalls are formed by a single laser beam cutting using a single cut. The single cut, for example, may be effected by a single pass or multiple passes, depending on the depth. Other configurations of or forming the passivation sidewalls, such as chamfered sidewalls, may also be useful. Forming mask openings chamfered sidewalls are described in co-pending U.S. application Ser. No. 18/056,726, titled "Plasma Diced Wafers and Methods thereof", which is already herein incorporated by reference for all purposes.

In one embodiment, the die below the passivation stack includes scalloped sidewalls 218. For example, in the case of a rectangular-shaped die, the four sidewalls below the passivation stack have scalloped sidewalls. The scalloped sidewalls, in one embodiment, result from a plasma dicing process using deposition and etch cycles. For example, each deposition and etch cycle forms a scallop-shaped subportion. The scalloped sidewalls include plasma-etched sidewall surfaces.

In one embodiment, the scalloped sidewalls partially extend into the substrate. For example, the scalloped sidewalls do not extend to the bottom surface $\mathbf{211}_B$ of the substrate. In one embodiment, the scalloped sidewalls extend to a depth of about 80-90% of the substrate, leaving about 10-20% of the substrate without scalloped sidewalls. For example, the partial plasma etch leaves a remaining portion of the substrate unetched (e.g., 10-20%). Partially etching the substrate to other depths may also be useful.

The depth of the scalloped sidewalls, in one embodiment, is equal to about the depth of a surface of a modified layer in the substrate. The modified layer, in one embodiment, is a stealth diced layer. For example, the stealth diced layer is disposed in the kerf regions of the wafer. Preferably, the stealth diced layer is disposed at about a center or central portion of the kerf regions of the wafer. The modified layer is a laser modified layer. The stealth diced layer includes cracks which facilitate the singulation of the wafer.

In one embodiment, for each side of the die, below the scalloped sidewall, the die includes a foot 213. The foot, as shown, extends outward from the scalloped sidewall. The foot may extend from the scalloped surface, in one embodiment, by about 10-90% of the kerf width. Extending the foot by other distances may also be useful.

The foot, for example, may be at the depth of the partial plasma etch. Foot side surfaces 214 are disposed below the scalloped side surfaces. The foot side surfaces are force separated side surfaces. For example, the foot side surfaces result from singulating the dies of the partially plasma diced wafer using lateral or stretching force. The lateral force is in the direction which is parallel to the major surfaces (top and bottom surface) of the wafer, extending outwardly from the edges of the wafer. The foot, for example, depends on the pull force of an expansion tool for singulating the processed wafer of which the die is a part. A top surface of the foot (surface facing the passivation layer) has a shape corresponding to the partial plasma etch.

In one embodiment, a bottom surface $\mathbf{211}_B$ of the die includes a die attach film (DAF) 240. The DAF, for example, may be an acrylic film or a polyester with polyolefin based film suitable for plasma dicing. Other materials suitable for plasma dicing, may also be useful. In one embodiment, DAF side surfaces 242 are aligned with the foot side surfaces. Like the foot side surfaces, the DAF side surfaces are force separated surfaces. For example, the wafer is separated in the same stretching process. Other configurations of the DAF may also be useful.

As shown, the die includes a DAF on the bottom surface of the substrate. The DAF further improves the reliability of the die by increasing die strength, die shear and die stability, particularly with thinned wafers. In addition, by partially plasma dicing the wafer, notching of the backside of the wafer is avoided, further improving reliability. Also, without the need to plasma etch the DAF to singulate the wafer, cross-contamination of the plasma chamber is avoided. This eliminates the need to clean the chamber, thereby increasing cycle time.

Figure 2B:
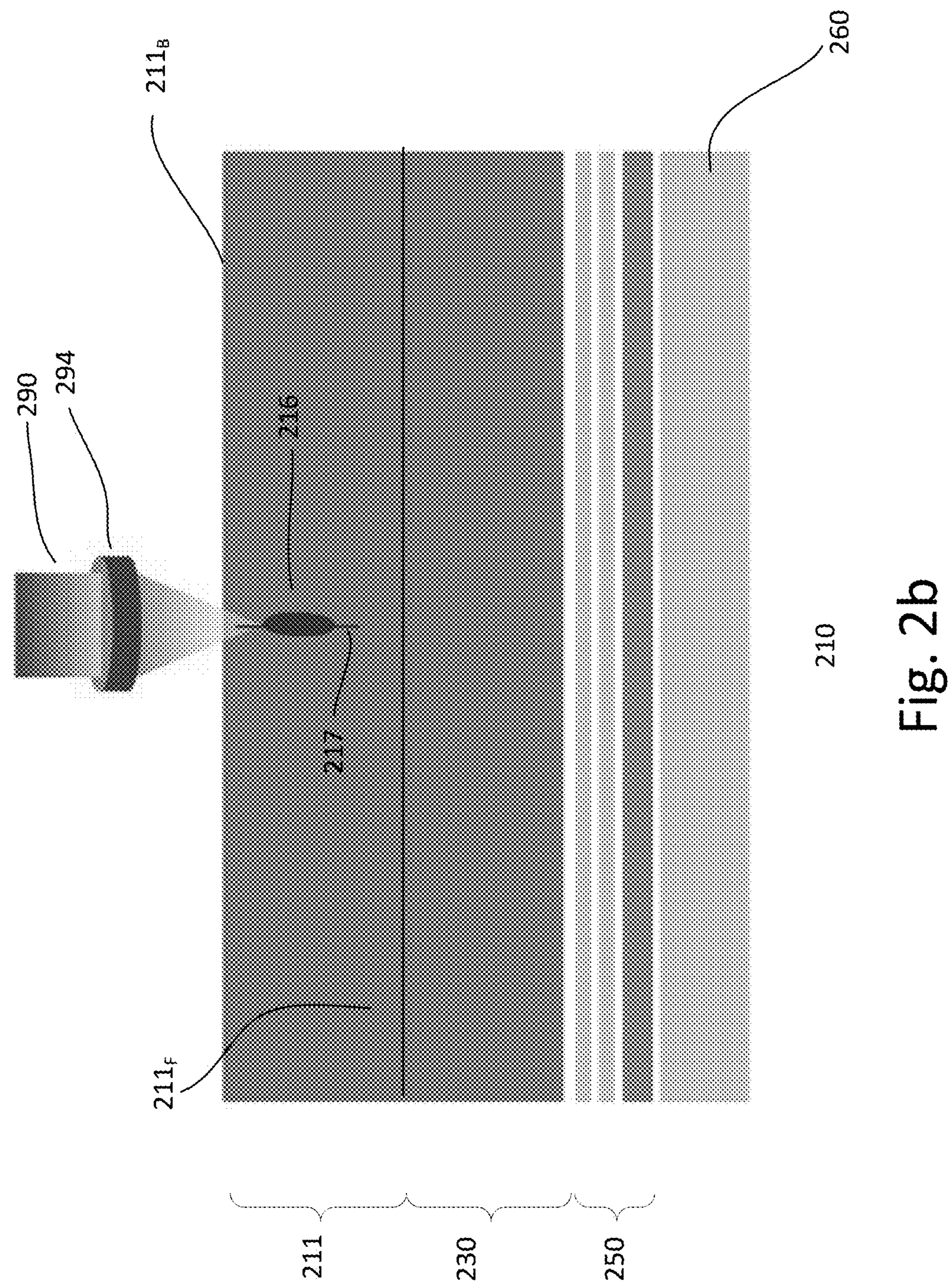
FIG. 2*b* shows a simplified embodiment of forming a modified layer in a low or bottom portion of a wafer.

FIG. 2b depicts an embodiment of forming a modified layer 216 at a lower or bottom portion of a processed wafer 210. The lower portion of the wafer, as shown, corresponds to a remaining portion of a subsequently partially plasma diced processed wafer. In some cases, the lower portion may correspond to a remaining portion of a partially plasma diced processed wafer. As shown, the portion of the wafer is shown corresponds to a dicing channel between adjacent dies in either the x or y direction. The wafer, for example, may be attached to a backgrinding (BG) tape 260. The passivation layer 250 of the processed wafer 210 is attached to the BG tape. The bottom $\mathbf{211}_B$ of the wafer 211, for example, may be thinned by backgrinding to a desired thickness, such as 50 to 300 microns (um), prior to laser processing to form the modified layer. Thinning the wafer to other thicknesses or not thinning the wafer may also be useful.

In one embodiment, the wafer is processed by laser processing from the bottom surface of the wafer. In one embodiment, a laser beam 290 is employed to process the processed wafer through the bottom surface of the wafer. A lens 294 focuses the laser beam below the bottom surface of the wafer to form the modified layer in the wafer. For example, the modified layer may be formed in the remaining portion of the wafer in a dicing channel of the wafer from the bottom or inactive surface of the wafer to the top of the remaining portion. For example, the modified layer may extend the thickness of the remaining portion of the wafer. The remaining portion of the wafer, for example, may be about 10% to 20% of the total thickness of the wafer. Other thicknesses for the remaining portion may also be useful. For a thinned wafer, the thickness may be about 125 um or less while for an unthinned wafer, it may be more than 125 um. Other thicknesses for thinned and unthinned wafers may also be useful. The laser forms cracks 217 in the modified layer along the kerf region of the wafer. The modified layer, for example, is disposed at about the center of the kerf region. The modified layer facilitates the singulation of the processed wafer.

As described, the laser processes the wafer through the bare bottom surface of the wafer before plasma dicing. In some embodiments, the laser may process the wafer through a DAF and dicing tape before plasma dicing. Alternatively, the laser processes through the bare bottom surface of the wafer or through the DAF and dicing tape after plasma dicing. Furthermore, depending on the thickness of the remaining portion, the laser processing for stealth dicing may be tailored by adjusting the laser power and or the use of multiple passes of the laser.

Figure 3A:
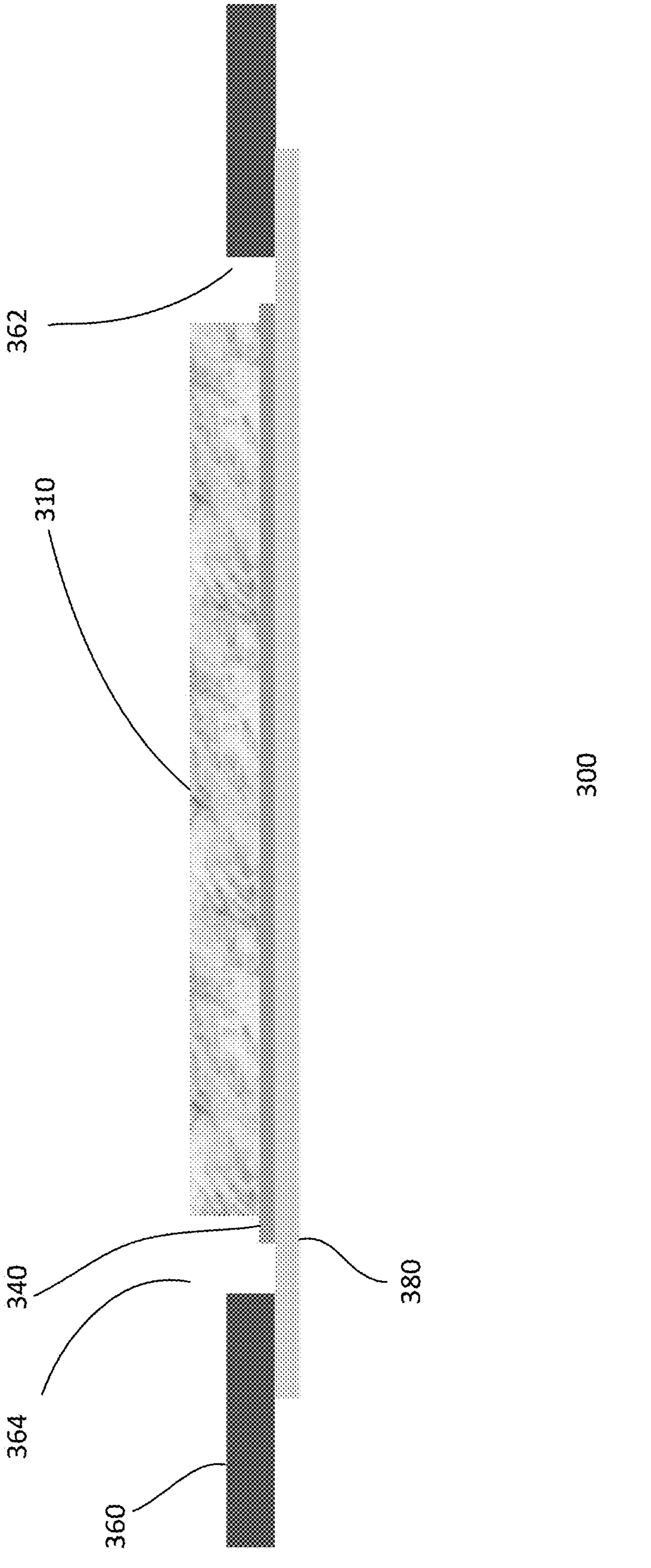
FIG. 3*a* shows a simplified cross-sectional view of a setup for a processed wafer in preparation for plasma dicing.

FIG. 3*a* shows an exemplary setup 300 for plasma dicing a wafer. As shown, a wafer ring assembly is provided. The wafer ring assembly includes a wafer ring frame 360 with a wafer ring frame opening 364 within the inner edge 362 of the frame. A dicing tape 380 is attached to a bottom surface of the wafer ring frame. In one embodiment, the dicing tape is an expandable dicing tape. An adhesive side of the dicing tape is facing upwards into the wafer ring frame opening. The opening is configured to accommodate a processed wafer 310. In one embodiment, attached to the bottom surface of the wafer is a DAF 340. For example, the bottom surface of the wafer is attached to the DAF and the DAF is attached to the dicing tape.

When the wafer with DAF is attached to the dicing tape and the wafer frame assembly, the wafer is processed. For example, the passivation layer of the wafer is patterned to form dicing channels in the x-direction and y-directions. Patterning the passivation layer may employ laser processing. Other techniques may also be employed for patterning the passivation layer. After forming dicing channels, the wafer ring assembly may be positioned into a plasma chamber for plasma dicing.

The exemplary setup is provided to merely described a general setup for plasma dicing. As described, the processed wafer includes a modified layer before being attached to the wafer ring assembly before patterning the passivation layer to form the plasma dicing mask and plasma dicing to partially form the dicing channels. In other embodiments, the processed wafer is attached to the wafer ring assembly with an unpatterned passivation layer and then processed to form the modified layer through the dicing tape and DAF, followed by patterning the passivation layer and plasma dicing to form the partial dicing channels. Alternatively, the processed wafer includes partially formed dicing channels and is then processed to form the modified layer. Processing to form the modified layer can be performed through the bare wafer bottom surface or through the wafer dicing tape and DAF.

FIGS. 3*b*-3*e* show various process flows for plasma dicing a processed wafer. A process flow, as previously described, can form the modified layer through the bare bottom surface of the wafer or through the wafer tape and DAF prior to plasma dicing to form the partial dicing channels. Alternatively, the modified layer can be formed through the bare bottom surface of the wafer or through the wafer tape and DAF after plasma dicing to form the partial dicing channels.

Figure 3B:
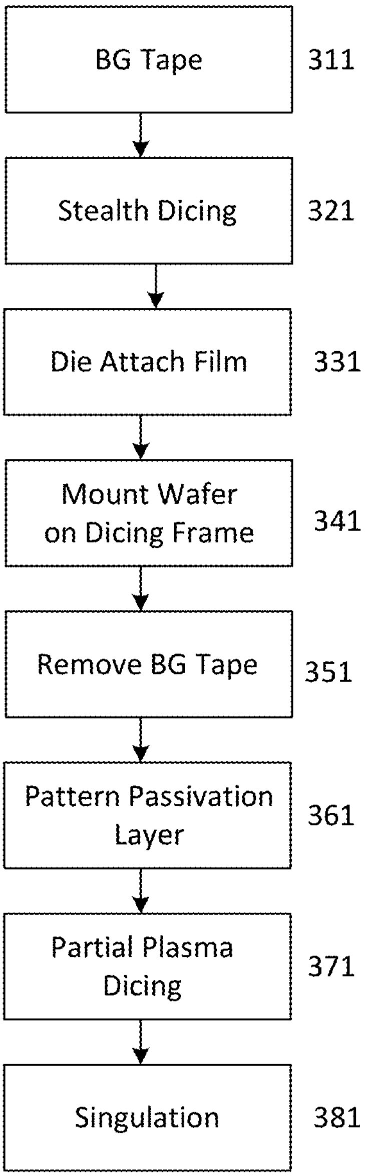
FIGS. 3*b*-3*e* show various embodiments of process flows for dicing a processed wafer.

Referring to FIG. 3*b*, an embodiment of a process flow for dicing a processed wafer is shown. The process flow includes forming a modified layer through the bare bottom wafer surface prior to plasma dicing. At 311, a BG tape is attached to the processed wafer. For example, the BG tape is attached to the passivation layer of the processed wafer. The BG tape may be part of a backgrinding assembly. Backgrinding may be performed on the inactive wafer surface to thin the processed wafer to a desired thickness, such as 50-300 um. Other processed wafer thicknesses may also be useful. In some cases, no backgrinding is performed.

Stealth dicing on the bottom surface of the wafer is performed at 321. In one embodiment, the stealth dicing includes laser processing through the back surface of the wafer without DAF to form the modified layer. A laser beam is focused through a lens to direct it to a dicing channel of the wafer. As previously discussed, the modified layer is located at about the center of the kerf region of a dicing channel and at a depth of about 10-20% of the wafer from the inactive or bottom surface of the wafer.

After forming the modified layer, a DAF is attached to the bottom surface of the wafer at 331. The bottom surface may be a ground surface. Alternatively, the bottom surface is unground. At 341, the processed wafer is mounted onto a wafer frame assembly with a wafer dicing tape. The DAF is attached to the wafer dicing tape.

The backgringing tape is removed at 351. Various techniques may be employed to remove the BG tape. Removal of the BG tape exposes the passivation layer. At 361, the passivation layer is patterned to form a plasma etch mask. In one embodiment, laser etching is employed to pattern the passivation layer, exposing the kerf regions of the dicing channels in the x and y directions.

The wafer ring assembly is then placed into a plasma dicing tool chamber at 371. The processed wafer is plasma diced, using the patterned passivation as an etch mask. The plasma dicing forms partial dicing channels to a depth equal to about a depth of the modified layer.

At 381, the wafer frame is removed from the plasma etching tool and transferred to a singulation tool. The singulation tool includes a dicing tape expansion module. The dicing tape expansion module expands the dicing tape outwards from the center of the wafer frame to singulate the partially plasma diced wafer into individual dies with DAF on its bottom substrate surface, as shown in FIG. 2*a*.

Figure 3C:
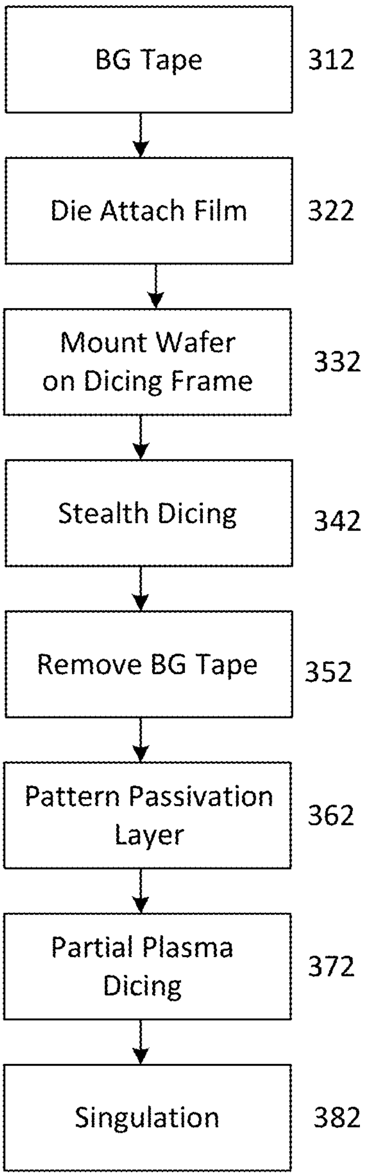

FIG. 3*c* shows another embodiment of a process flow for dicing a processed wafer. The process flow includes forming a modified layer through the wafer dicing tape and DAF prior to plasma dicing. The process flow may include similar processing, as described in FIG. 3*b*. Common processing may not be described or described in detail. At 311, a BG tape is attached to the processed wafer. Backgrinding may be performed on the inactive wafer surface to thin the processed wafer to a desired thickness. In some cases, backgrinding is not performed.

After backgrinding, a DAF is attached to the bottom surface of the wafer at 322. The bottom surface may be a ground or an unground surface. At 332, the processed wafer with the DAF is mounted onto a wafer frame assembly with a wafer dicing tape. Stealth dicing on the bottom surface of the wafer is performed at 342. The stealth dicing includes laser processing through the wafer dicing tape and DAF to form the modified layer.

At 352, after stealth dicing, the BG tape is removed. The passivation layer, at 362, is patterned to form a plasma etch mask. In one embodiment, laser etching is employed to pattern the passivation layer, exposing the kerf regions of the dicing channels in the x and y directions.

The wafer ring assembly is then placed into a plasma dicing tool chamber at 372. The processed wafer is plasma diced, using the patterned passivation as an etch mask. The plasma dicing forms partial dicing channels to a depth equal to about a depth of the modified layer. The wafer frame is removed from the plasma etching tool and transferred to a singulation tool at 382. The singulation tool expands the dicing tape outwards from the center of the wafer frame to singulate the partially plasma diced wafer into individual dies with DAF on its bottom substrate surface, as shown in FIG. 2*a*.

Figure 3D:
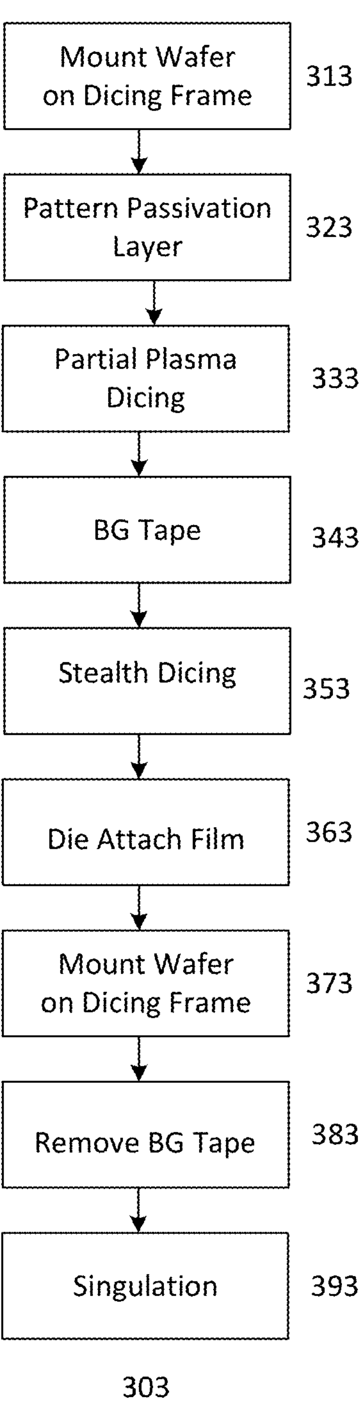

FIG. 3*d* shows yet another embodiment of a process flow for dicing a processed wafer. The process flow forms a modified layer through the bare inactive wafer surface of a partially plasma etched or diced wafer. The process flow may include similar processing, as those described in FIGS. 3*b*-3*c*. Common processing may not be described or described in detail.

At 313, the processed wafer is mounted onto a wafer frame assembly with a wafer dicing tape. The passivation layer, at 323, is patterned to form a plasma etch mask which exposes the kerf regions of the dicing channels in the x and y directions. The wafer ring assembly is then placed into a plasma dicing tool chamber at 333 for partially dicing the processed wafer using the patterned passivation layer.

At 343, a BG tape is attached to the processed wafer after plasma dicing. Backgrinding may be performed on the inactive wafer surface to thin the processed wafer to a desired thickness. In some cases, backgrinding is not performed.

Stealth dicing on the bottom surface of the wafer is performed at 353. The stealth dicing includes laser processing with partial dicing channels through the bare inactive wafer surface. The processing may be performed through a ground or unground inactive wafer surface. After stealth dicing, a DAF is attached to the bottom surface of the wafer at 363. At 373, the processed wafer with the DAF is mounted onto a wafer frame assembly with a wafer dicing tape.

At 383, the backgringing tape is removed. The wafer ring assembly is then transferred to a singulation tool at 393. The singulation tool expands the dicing tape outwards from the center of the wafer frame to singulate the partially plasma diced wafer into individual dies with DAF on its bottom substrate surface, as shown in FIG. 2*a*.

Figure 3E:
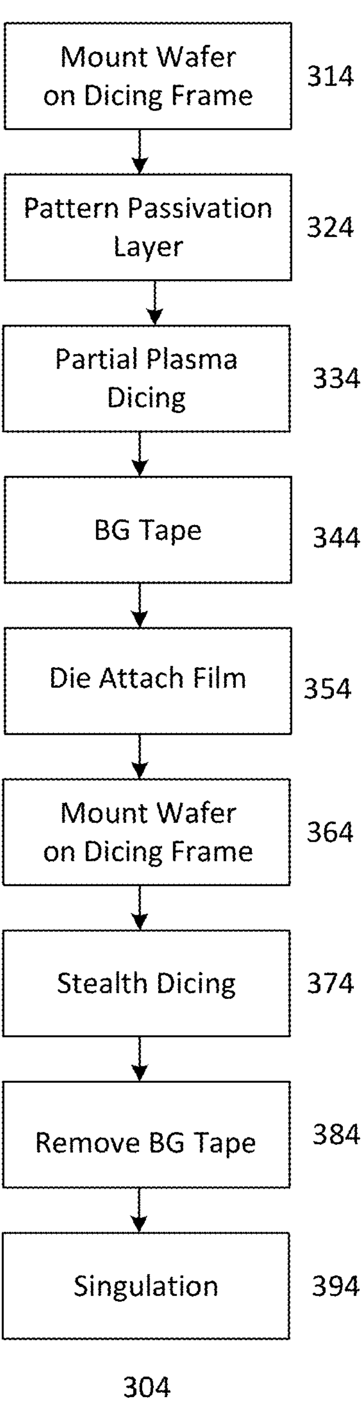

Another embodiment of a process flow for dicing a processed wafer is shown in FIG. 3*e*. The process flow forms a modified layer through a wafer dicing tape and DAF on the inactive wafer surface of a partially plasma etched or diced wafer. The process flow may include similar processing, as those described in FIGS. 3*b*-3*d*. Common processing may not be described or described in detail.

At 314, the processed wafer is mounted onto a wafer frame assembly with a wafer dicing tape. The passivation layer, at 324, is patterned to form a plasma etch mask which exposes the kerf regions of the dicing channels in the x and y directions. The wafer ring assembly is then placed into a plasma dicing tool chamber at 334 for partially dicing the processed wafer using the patterned passivation layer.

At 344, a BG tape is attached to the processed wafer after plasma dicing. Backgrinding may be performed on the inactive wafer surface to thin the processed wafer to a desired thickness. In some cases, backgrinding is not performed.

A DAF is attached to the bottom surface of the wafer at 354. At 364, the processed wafer with the DAF is mounted onto a wafer frame assembly with a wafer dicing tape. Stealth dicing on the bottom surface of the wafer is performed at 374. The stealth dicing includes laser processing with partial dicing channels through the bare inactive wafer surface. The processing may be performed through the wafer dicing tape and DAF.

At 384, the BG tape is removed. The wafer ring assembly is then transferred to a singulation tool at 394. The singulation tool expands the dicing tape outwards from the center of the wafer frame to singulate the partially plasma diced wafer into individual dies with DAF on its bottom substrate surface, as shown in FIG. 2*a*.

FIGS. 4*a*-4*g* show simplified cross-sectional views of an embodiment of a process 400 for plasma dicing a processed wafer to singulate it into individual dies. Illustratively, a portion of the wafer is shown. The processed wafer and portion of the wafer are similar to that shown in FIGS. 1*a*-1*b* and the dies are similar to the die described in FIG. 2. The process is similar to that described in FIG. 3*b*. For example, the process forms the modified layer through the bare inactive surface of the wafer prior to partial plasma dicing. Common elements may not be described or described in detail.

Figure 4A:
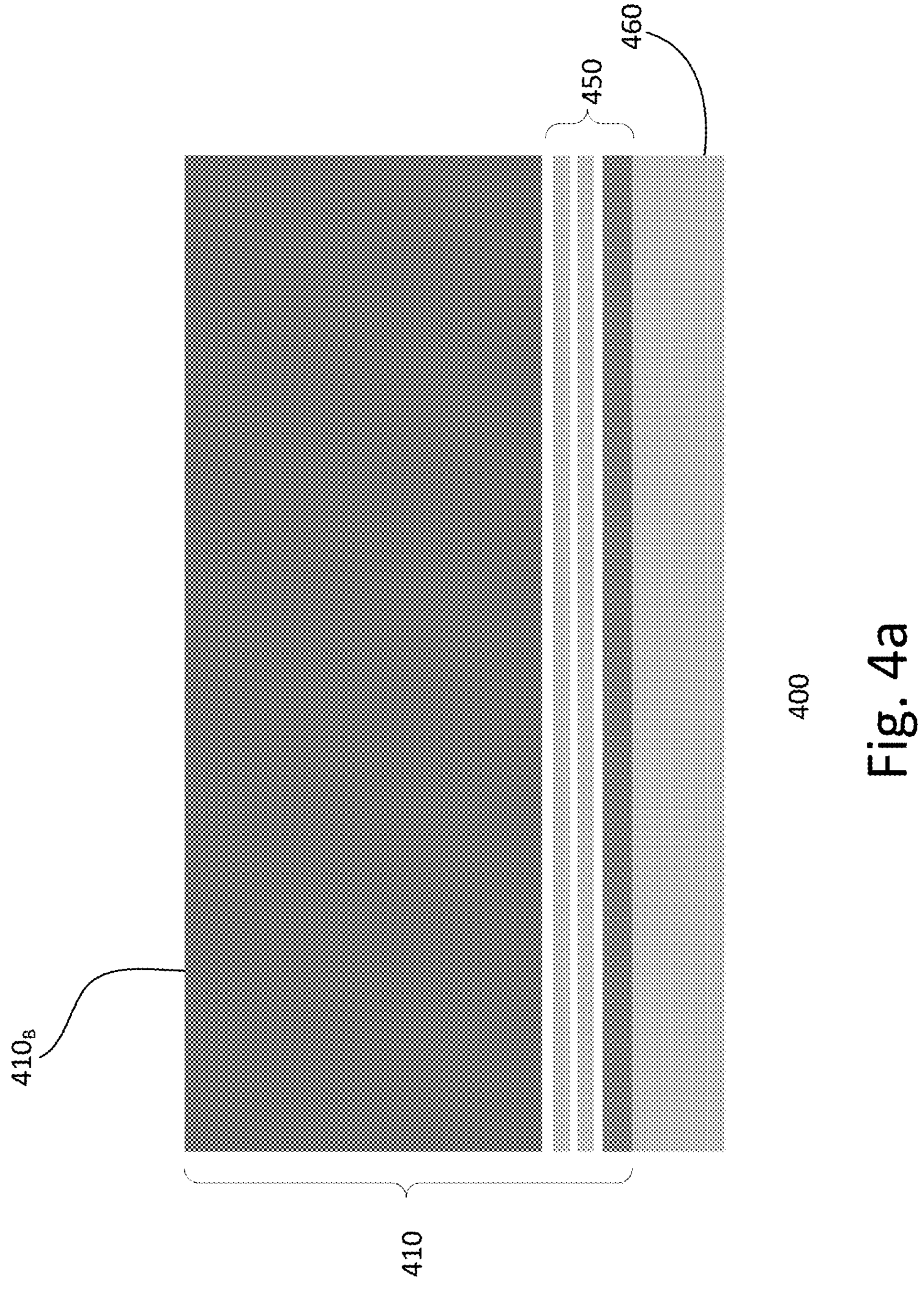
FIGS. 4*a*-4*g* show simplified cross-sectional views depicting a process for plasma dicing a wafer.

Referring to FIG. 4*a*, the portion of the processed wafer shown includes two adjacent dies with a saw street and a kerf region therein. Gap regions separate the edges of the saw street and kerf region. The processed wafer 410 includes a wafer with circuit components, a BEOL dielectric with interconnects over the wafer's active surface and a passivation stack 450 on the BEOL dielectric. A BG tape 460 is attached to the processed wafer. For example, the BG tape is attached to the surface of the passivation stack. This leaves the inactive surface of the wafer exposed. In some embodiments, the inactive surface of the wafer may be ground to thin the processed wafer to the desired thickness. Alternatively, no grinding of the wafer is performed.

Figure 4B:
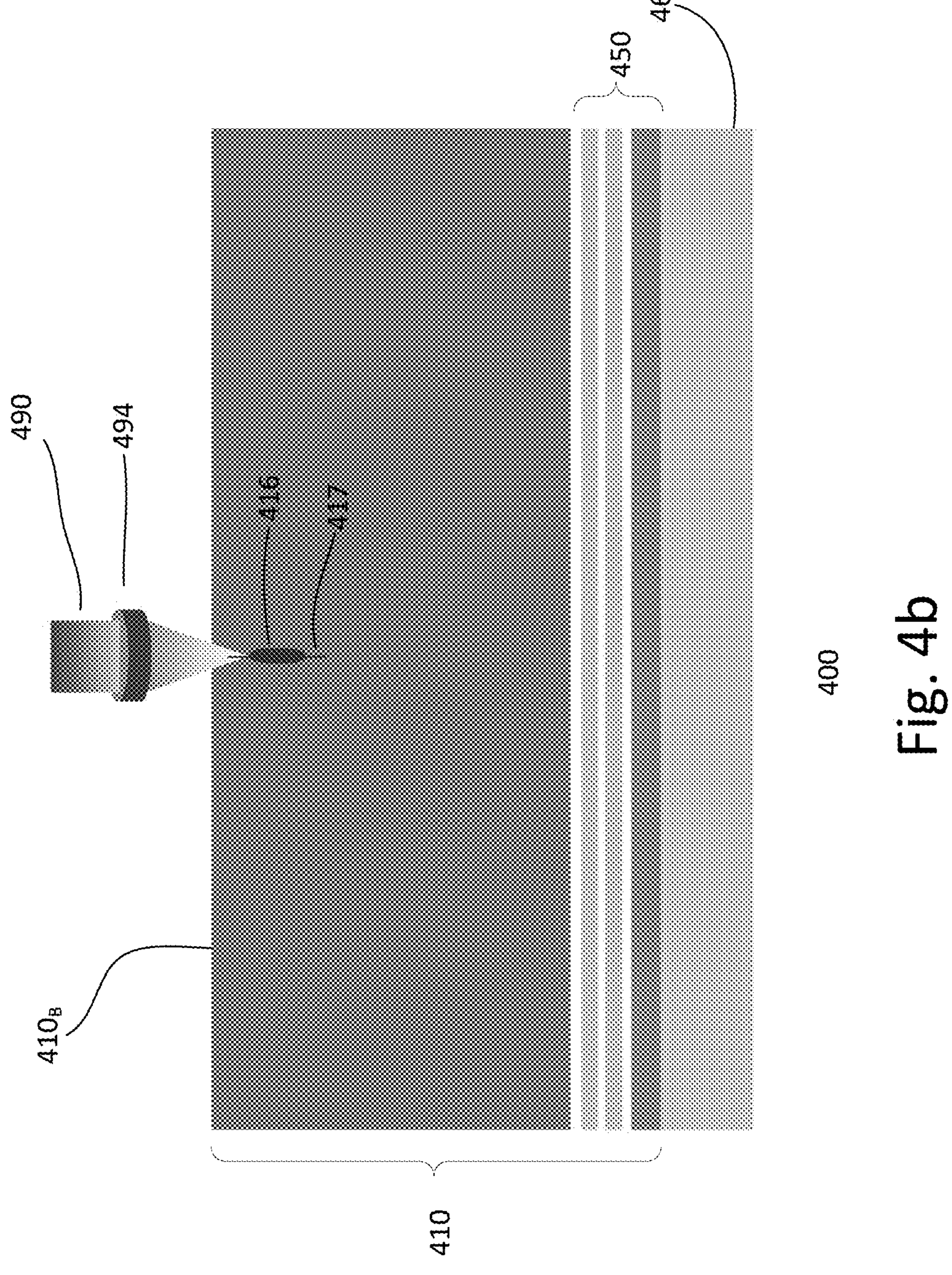

Referring to FIG. 4*b*, stealth dicing is performed. In one embodiment, a laser beam 490 from a laser is employed for stealth dicing. The laser beam is focused through a lens 494 into the inactive wafer surface $\mathbf{410}_B$. The laser is focused to a desired depth to form a modified layer 416 with cracks 417 in the dicing channels of the wafer. As previously discussed, the modified layer is located at about the center of the kerf region of a dicing channel. The modified layer occupies about 10-20% of the wafer from the inactive surface of the wafer. Other depths may also be useful.

After forming the modified layer, a DAF 440 is attached to the bottom surface of the wafer 410. The bottom surface $\mathbf{410}_B$ of the wafer may be a ground surface. Alternatively, the bottom surface is unground. The processed wafer is mounted onto a wafer dicing tape 480. For example, the wafer dicing tape is on the wafer film frame, forming a wafer frame assembly. The DAF is attached to the wafer dicing tape.

Figure 4C:
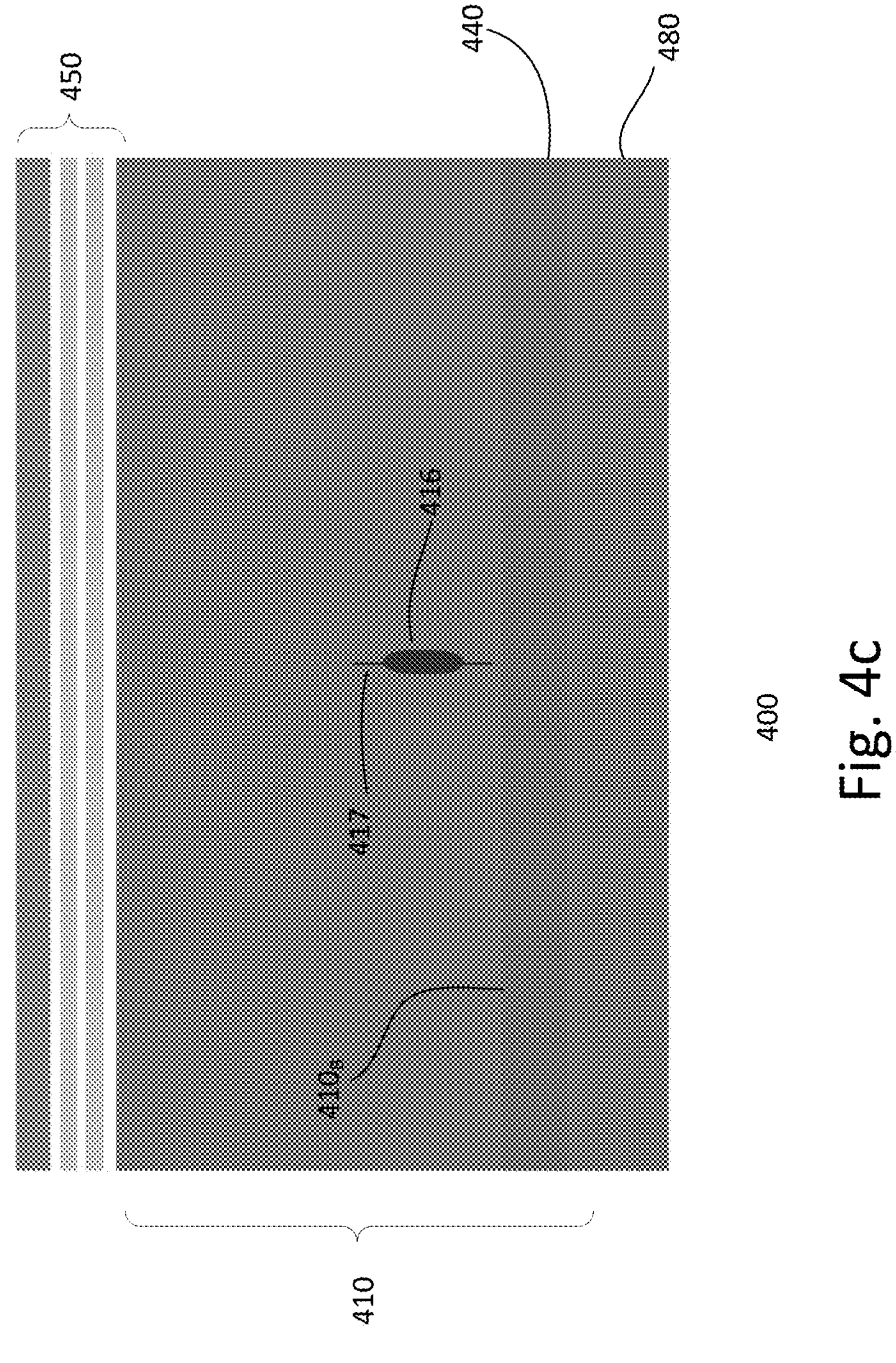
Figure 4D:
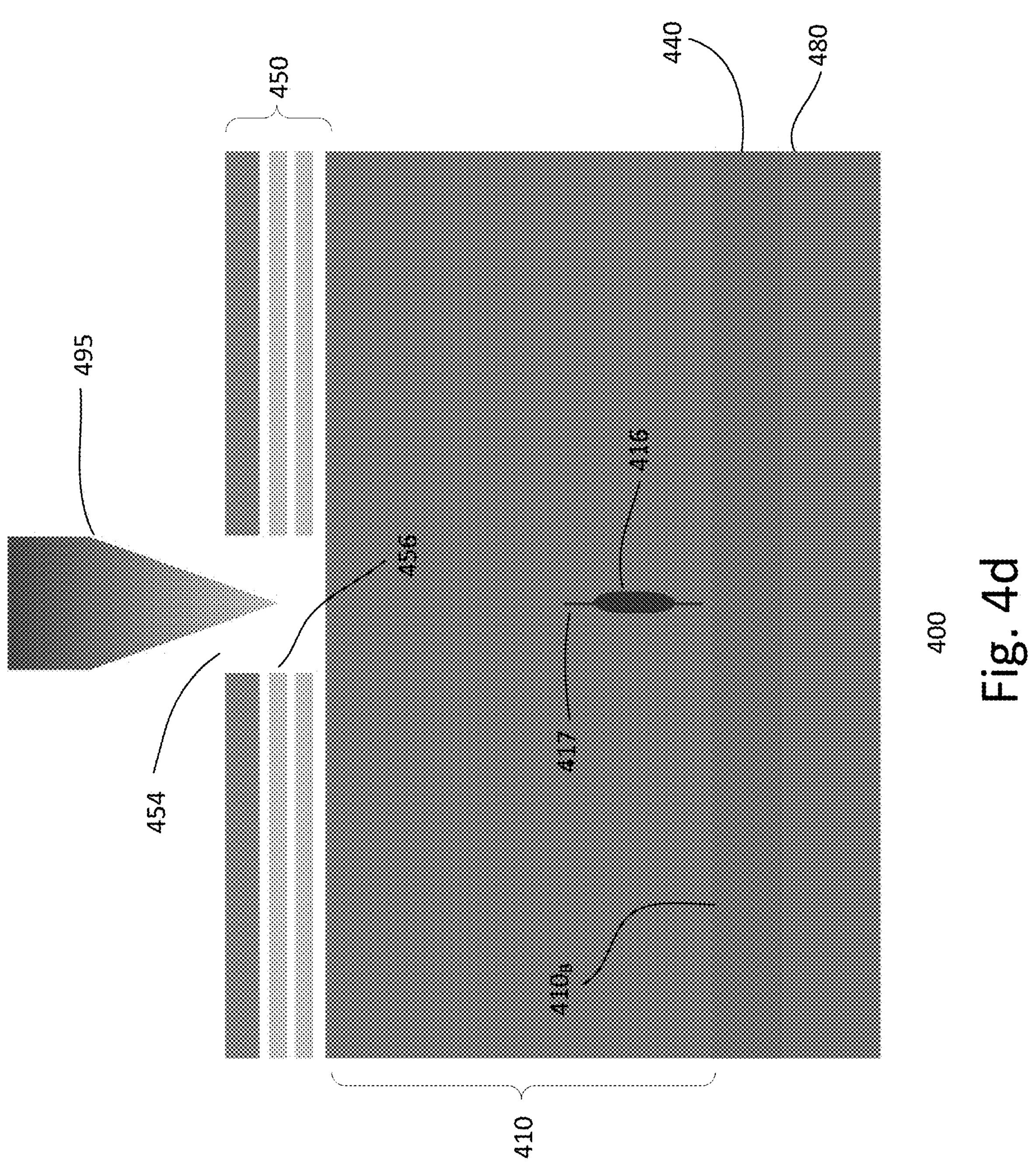

Referring to FIG. 4*d*, the wafer is processed to form mask openings 454 defining plasma dicing channels. For example, the passivation stack serves as a dicing mask for plasma dicing. In one embodiment, the plasma dicing channels correspond to the kerf regions of the wafer. Forming the mask openings may be achieved using laser processing. For example, a laser beam is used to pattern the passivation stack to form mask openings. The mask openings expose the kerf regions of the wafer. The laser beam cuts the passivation stack in the x-direction and y-direction to expose the kerf regions.

In one embodiment as shown, the laser processing forms mask openings in the passivation stack with flat sidewalls 456. In one embodiment, the flat sidewalls are vertical sidewalls. Forming non-vertical flat sidewalls may also be useful. For example, the sidewalls may be chamfered sidewalls. Forming chamfered sidewalls in the passivation stack is described in, for example, U.S. application Ser. No. 18/056,726, which is already incorporated by reference for all purposes. The mask opening process is finished when all kerf regions are exposed. After mask processing is completed, the wafer is transferred to a plasma dicing tool. For example, the wafer is transferred to a plasma chamber of a plasma dicing tool.

Figure 4E:
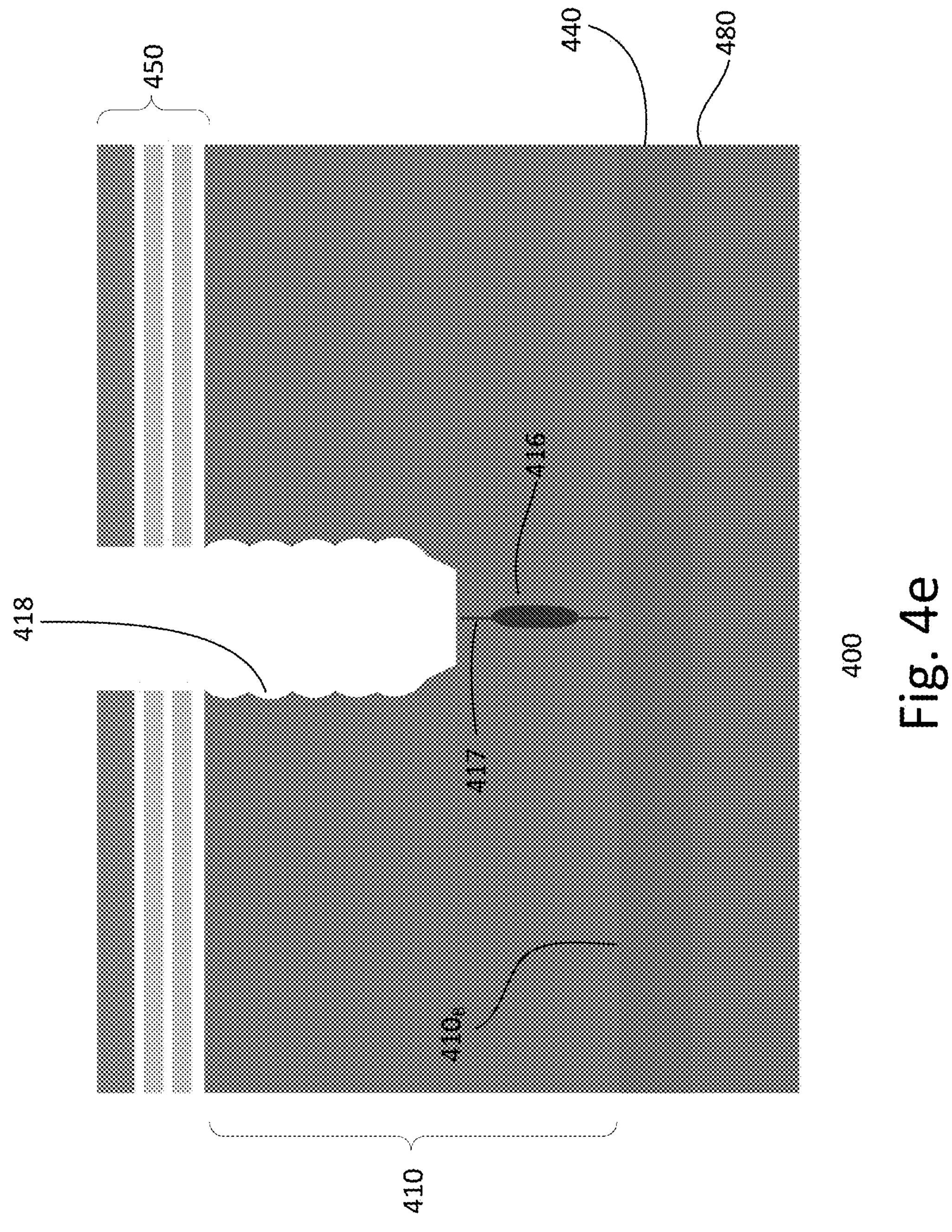

In FIG. 4*e*, the plasma from the plasma dicing tool etches the wafer. The plasma etches the processed wafer 410 using the passivation stack as the dicing mask. In one embodiment, the plasma partially etches the processed wafer. For example, the BEOL dielectric is etched while the wafer is partially etched. In one embodiment, the wafer is partially etched to about the top of the modified region 416. The plasma process, in one embodiment, employs deposition and etch cycles. The plasma process forms scalloped die sidewalls 418. Each cycle of deposition and etch forms 1 scalloped sub-portion. However, since the passivation serves as a dicing mask, it is not affected by the plasma etch.

Figure 4F:
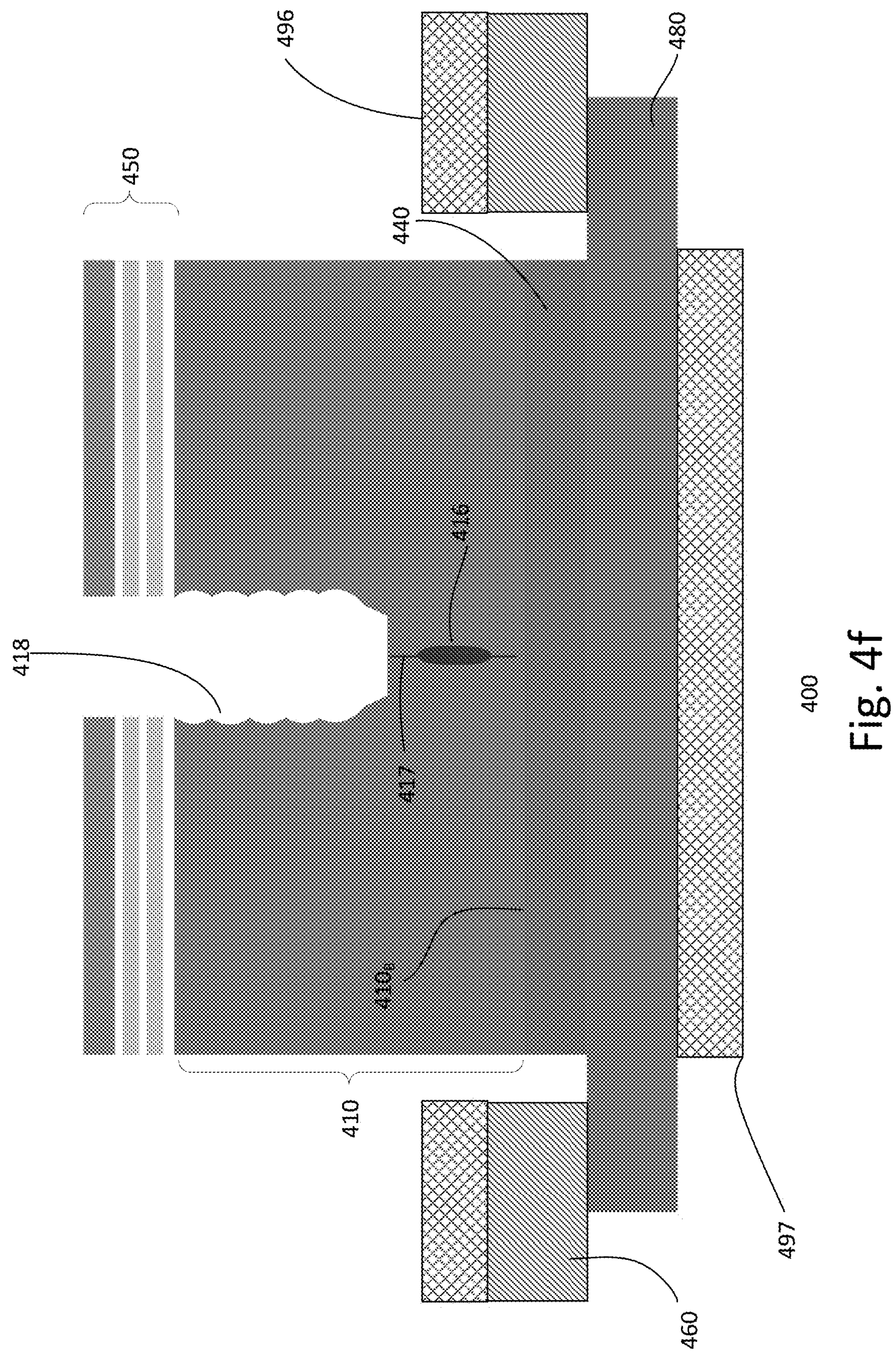

After plasma processing, the wafer ring assembly with the partially diced wafer is removed from the plasma tool. Referring to FIG. 4*f*, the next stage of the singulation process is performed. In one embodiment, the dicing tape is attached to a film expansion tool to expand the dicing tape 480. For example, the wafer frame 460 of the wafer frame assembly is mounted onto a film expansion tool. A clamp 496 of the film expansion tool holds the wafer frame in position.

Figure 4G:
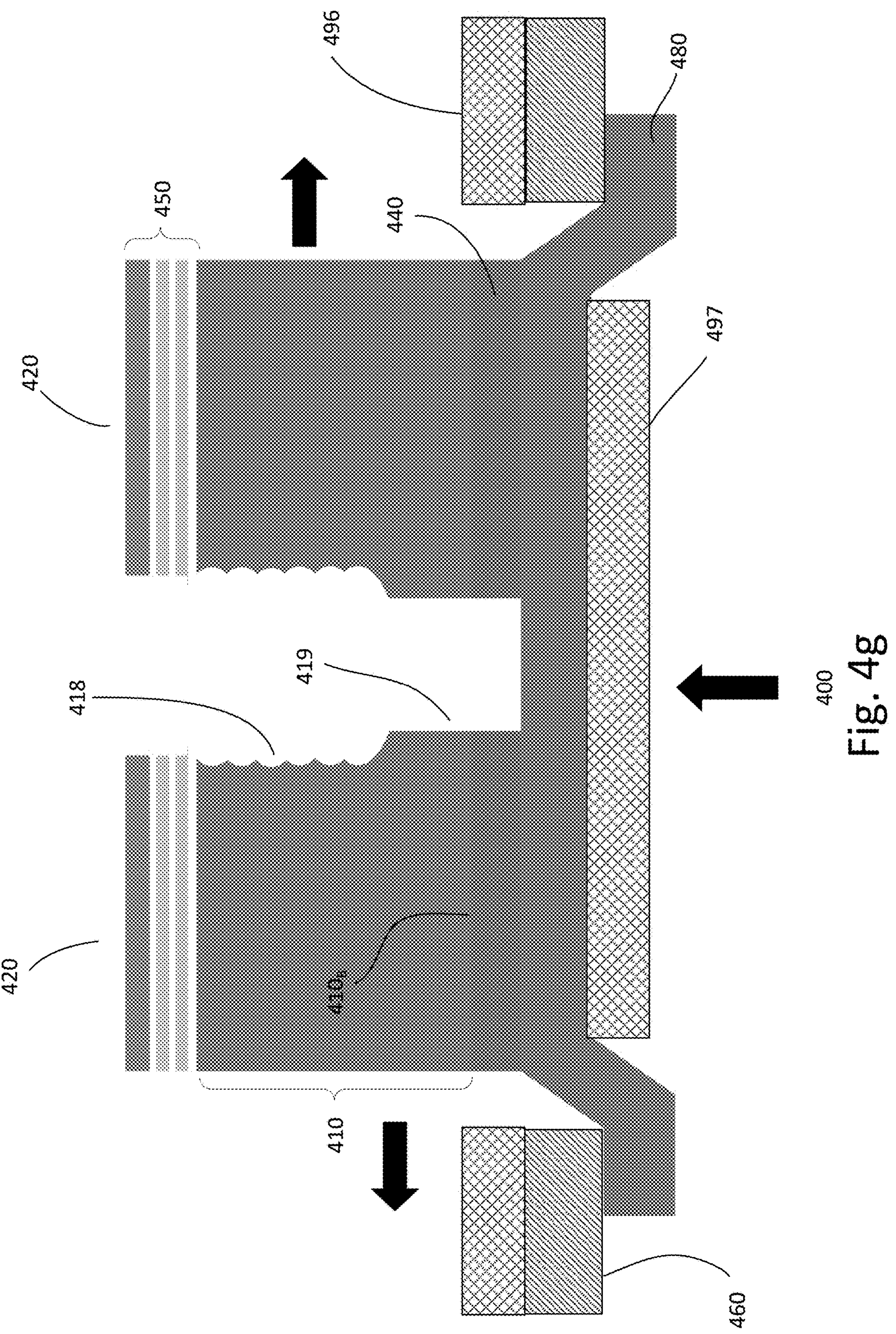

Referring to FIG. 4*g*, the dicing tape 480 is expanded laterally from the center of the wafer. A tape expansion fixture 497 on the film expansion tool may be employed to press on the wafer ring assembly to ensure the tape is evenly expanded, breaking the remaining portion of the wafer with the modified layer and the DAF. For example, the fixture is presses against the dicing tape as it is elevated upwards to expand the dicing tape. The side surface of the wafer and the DAF includes a vertical sidewall 419. This completes the singulation process.

Figure 5A:
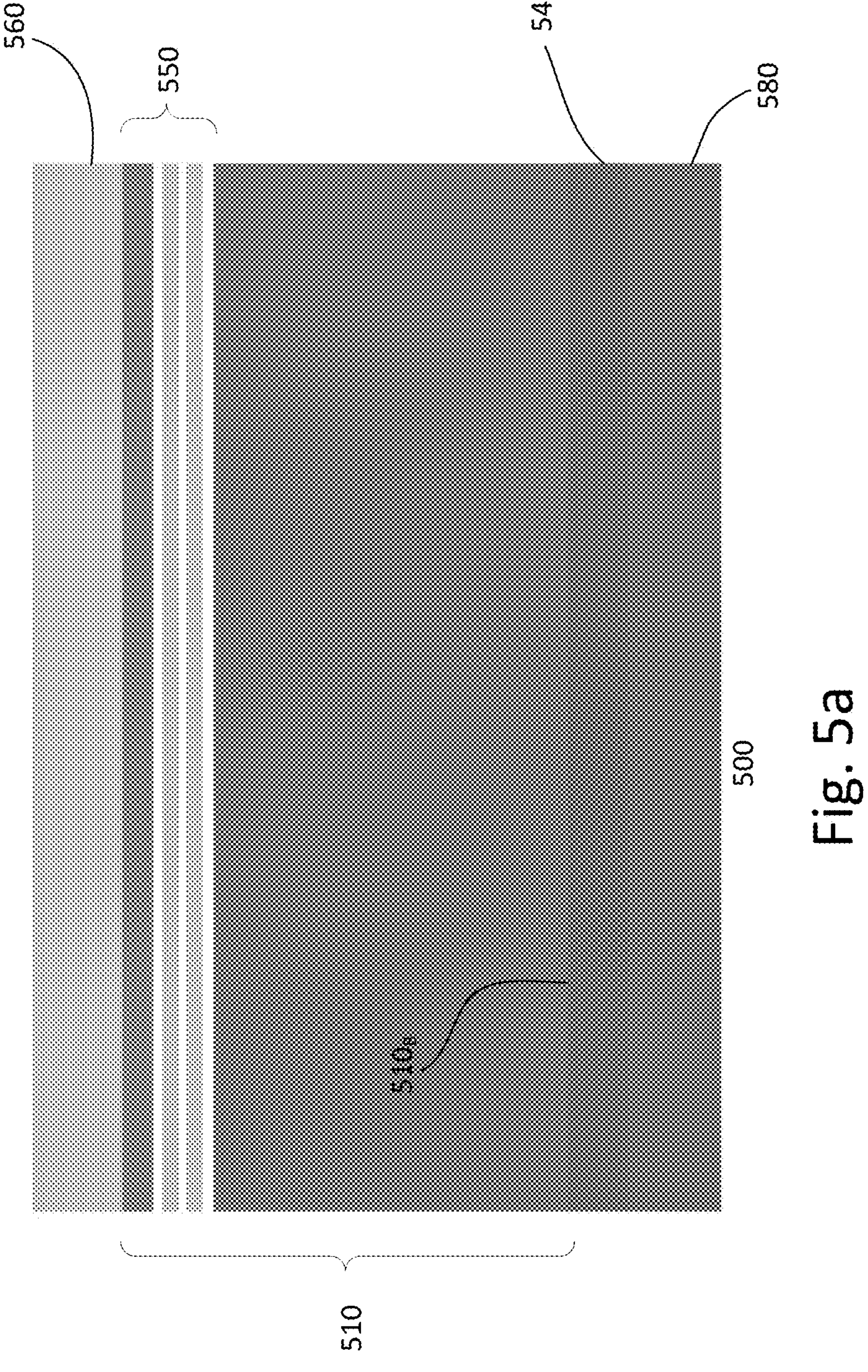
FIGS. 5*a*-5*c* show simplified cross-sectional views depicting another process for plasma dicing a wafer.

FIGS. 5*a*-4*c* show simplified cross-sectional views of a portion of another embodiment of a process 500 for plasma dicing a processed wafer to singulate it into individual dies. Illustratively, a portion of the wafer is shown. The processed wafer and portion of the wafer are similar to that shown in FIGS. 1*a*-1*b* and the dies are similar to the die described in FIG. 2. The portion of the process is similar to that described in FIG. 3*c*. For example, the process forms the modified layer through the dicing tape and DAF prior to partial plasma dicing. Furthermore, the process includes similar processing as described in FIGS. 4*a*-4*g*. Common elements may not be described or described in detail.

Referring to FIG. 5*a*, the portion of the processed wafer shown includes two adjacent dies with a saw street and a kerf region therein. Gap regions separate the edges of the saw street and kerf region. The processed wafer 510 includes a wafer with circuit components, a BEOL dielectric with interconnects over the wafer active surface and a passivation stack 550 on the BEOL dielectric. A BG 560 is attached to the processed wafer. For example, the BG tape is attached to the surface of the passivation stack. This leaves the inactive surface of the wafer exposed. In some embodiments, the inactive surface of the wafer may be ground to thin the processed wafer to the desired thickness. Alternatively, no grinding of the wafer is performed.

A DAF 540 is attached to the $\mathbf{510}_B$ bottom surface of the wafer 510. The bottom surface of the wafer may be a ground surface. Alternatively, the bottom surface is unground. The processed wafer is mounted onto a wafer dicing tape 580. For example, the wafer dicing tape is on the wafer film frame, forming a wafer frame assembly. The DAF is attached to the wafer dicing tape.

Figure 5B:
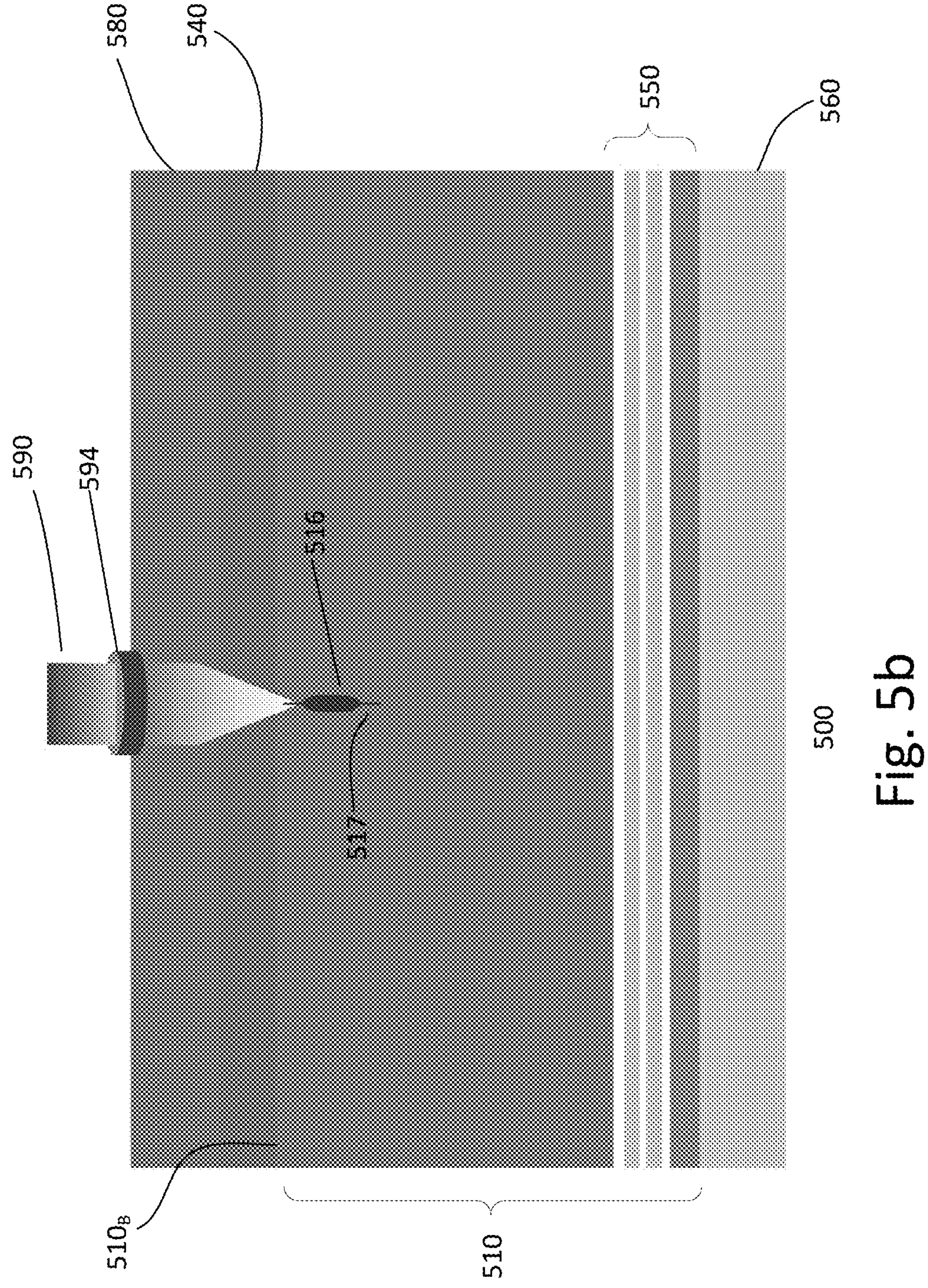

Referring to FIG. 5*b*, stealth dicing is performed. In one embodiment, a laser beam 590 from a laser is employed for stealth dicing. The laser beam is focused through a lens 594. The laser beam penetrates the dicing tape, DAF and into the inactive wafer surface $\mathbf{510}_B$. The laser is focused to a desired depth to form a modified layer 516 with cracks 517 in the dicing channels of the wafer.

Figure 5C:
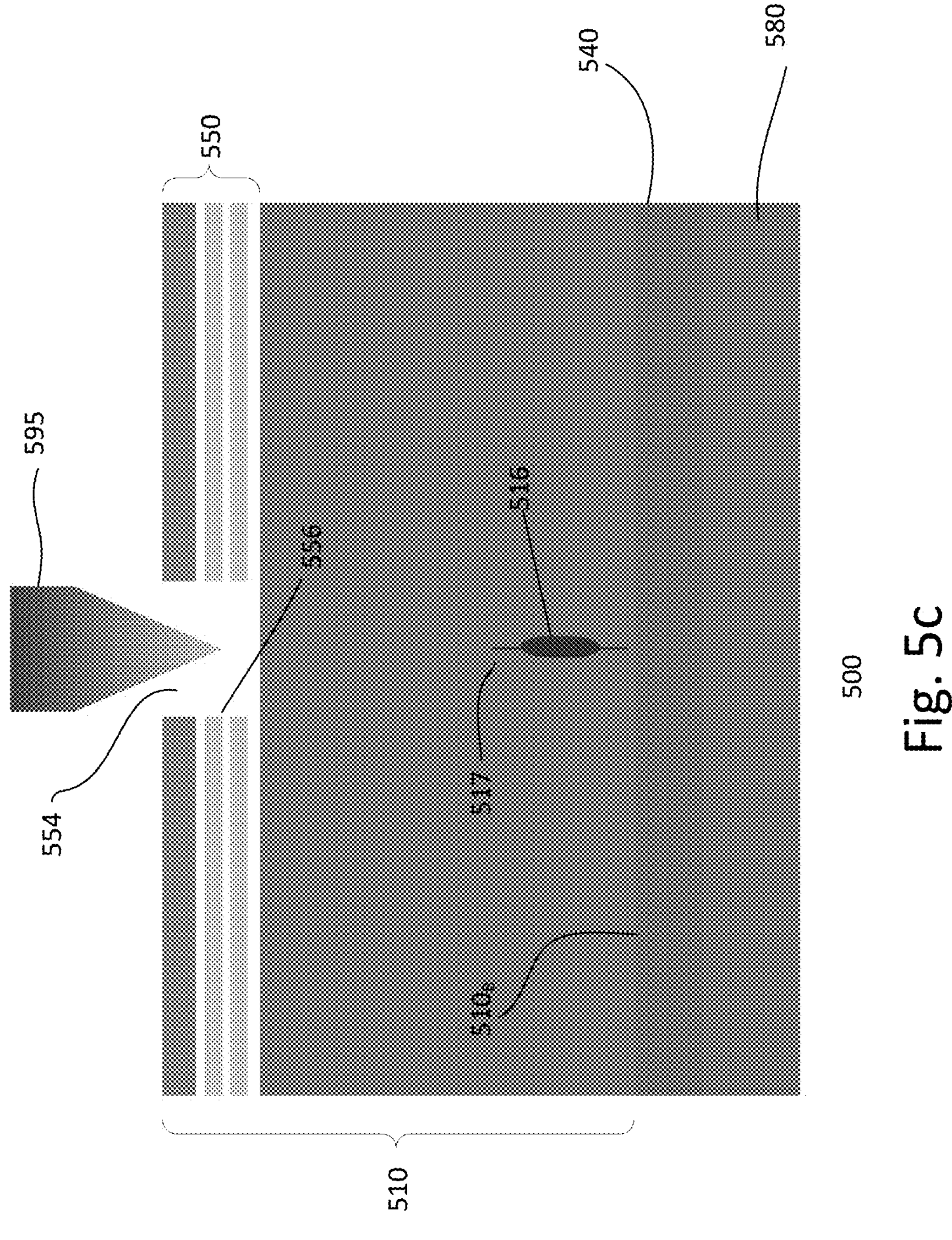

As shown in FIG. 5*c*, the wafer is processed to form mask openings 554 defining plasma dicing channels. For example, the passivation stack serves as a dicing mask for plasma dicing. In one embodiment, the plasma dicing channels correspond to the kerf regions of the wafer. Forming the mask openings may be achieved using laser processing. For example, a laser beam is used to pattern the passivation stack to form mask openings. The mask openings expose the kerf regions of the wafer. The laser beam cuts the passivation stack in the x-direction and y-direction to expose the kerf regions.

In one embodiment as shown, the laser processing forms mask openings in the passivation stack with flat sidewalls 556. In one embodiment, the flat sidewalls are vertical sidewalls. Forming non-vertical flat sidewalls may also be useful. After mask processing is completed, the wafer is transferred to a plasma dicing tool. The process continues as described in FIGS. 4*e*-4*g*.

FIGS. 6*a*-6*f* show simplified cross-sectional views of a portion of yet another embodiment of a process 600 for plasma dicing a processed wafer to singulate it into individual dies. Illustratively, a portion of the wafer is shown. The processed wafer and portion of the wafer are similar to that shown in FIGS. 1*a*-1*b* and the dies are similar to the die described in FIG. 2. The portion of the process is similar to that described in FIG. 3*d*. For example, the process forms the modified layer through the bare inactive surface of the wafer after partial plasma dicing. Furthermore, the process includes similar processing as described in FIGS. 4*a*-4*g* and FIGS. 5*a*-*c*. Common elements may not be described or described in detail.

Figure 6A:
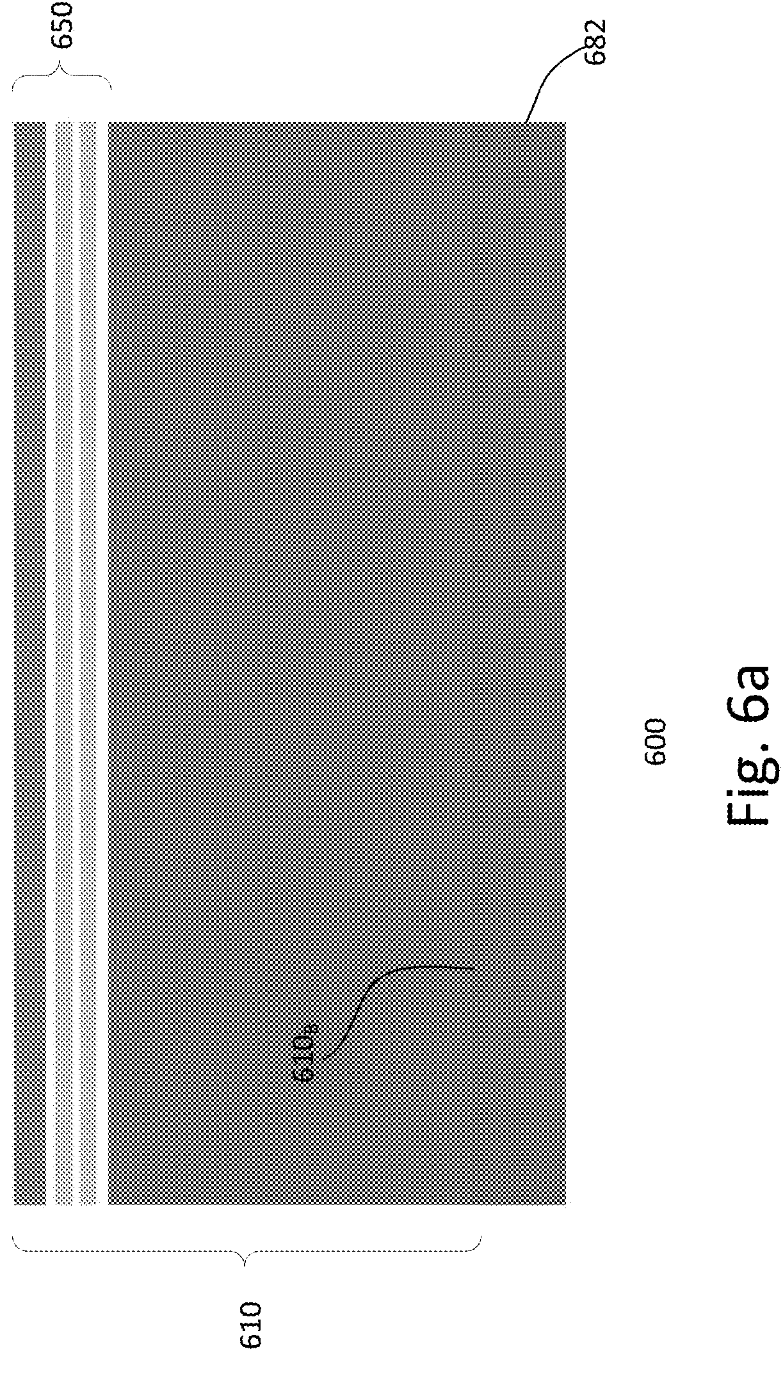
FIGS. 6*a*-6*f* show simplified cross-sectional views depicting yet another process for plasma dicing a wafer.

Referring to FIG. 6*a*, the portion of the processed wafer shown includes two adjacent dies with a saw street and a kerf region therein. Gap regions separate the edges of the saw street and kerf region. The processed wafer 610 includes a wafer with circuit components, a BEOL dielectric with interconnects over the wafer active surface and a passivation stack 650 on the BEOL dielectric. The processed wafer is mounted onto a wafer dicing tape 682. For example, the wafer dicing tape is on a wafer film frame. The inactive surface of the wafer $\mathbf{610}_B$ is attached to the wafer dicing tape.

Figure 6B:
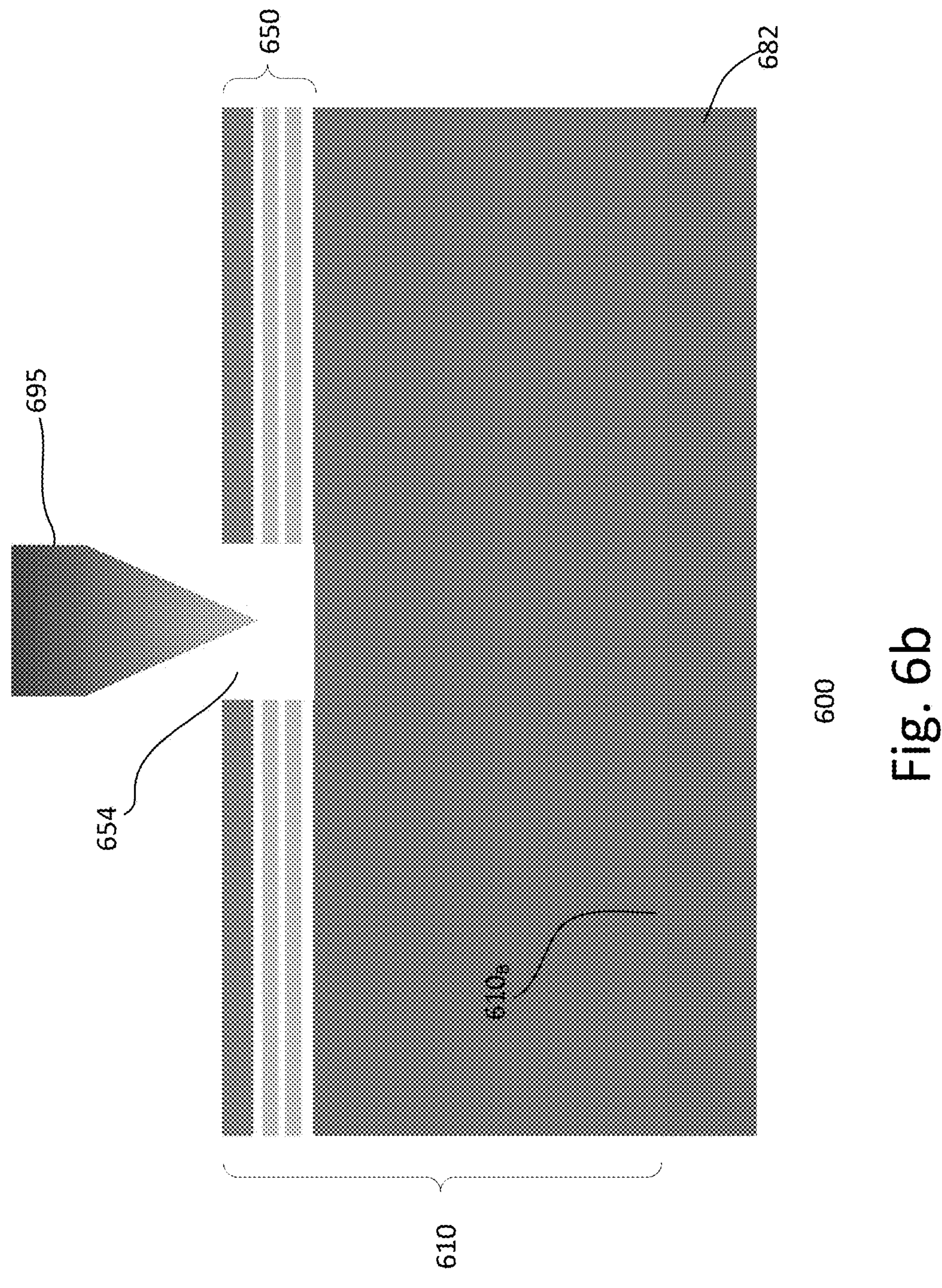

In FIG. 6*b*, the wafer is processed to form mask openings 654 defining plasma dicing channels. For example, the passivation stack serves as a dicing mask for plasma dicing. Forming the mask openings may be achieved using laser processing. For example, a laser beam is used to pattern the passivation stack to form mask openings. The mask openings expose the kerf regions of the wafer. The laser beam cuts the passivation stack in the x-direction and y-direction to expose the kerf regions. As shown, the laser processing forms mask openings in the passivation stack with flat sidewalls 656. In one embodiment, the flat sidewalls are vertical sidewalls. Forming non-vertical flat sidewalls may also be useful.

Figure 6C:
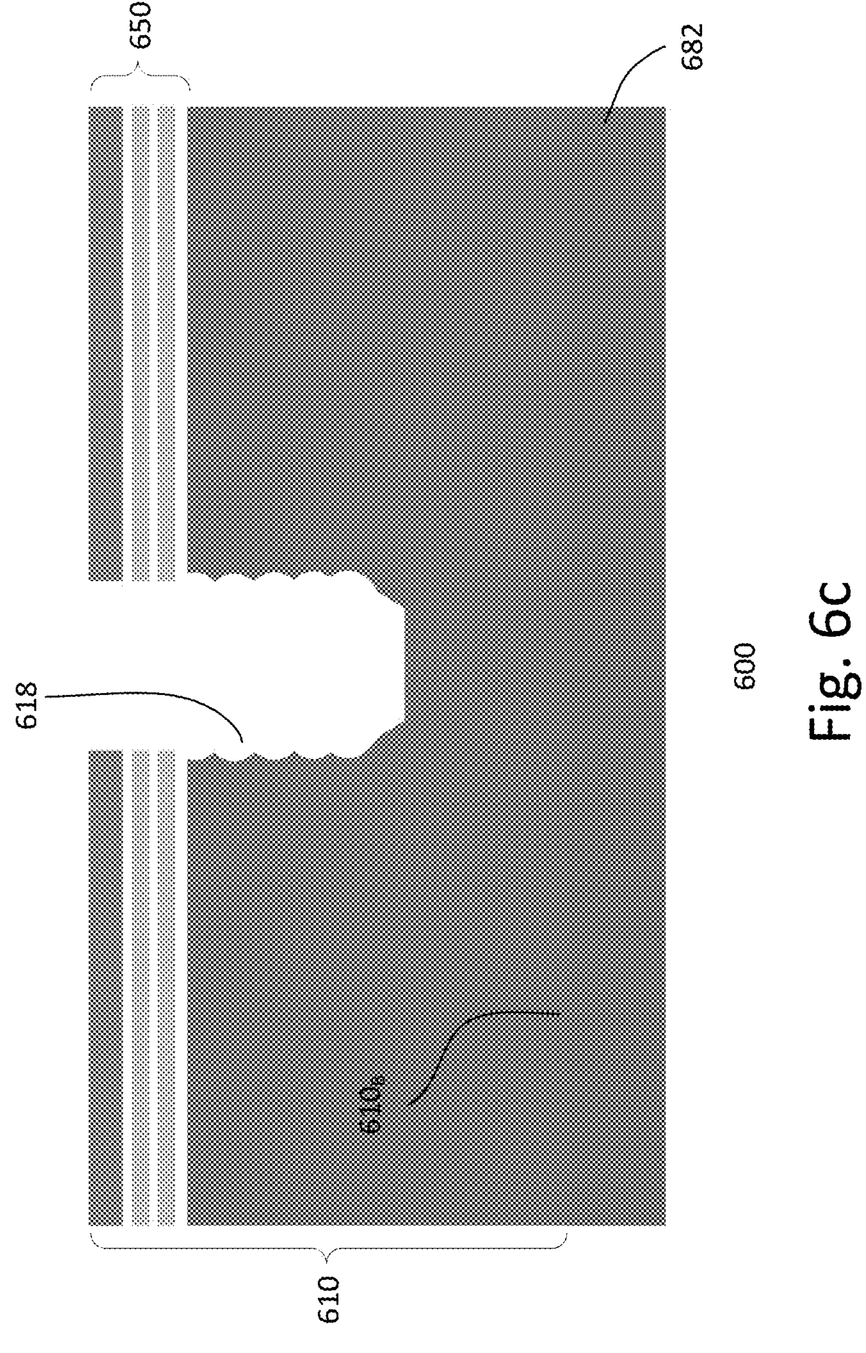

Referring to FIG. 6*c*, after mask processing is completed, the wafer ring with the wafer is transferred to a plasma dicing tool. The plasma tool partially dices the processed wafer using the patterned passivation stack as a dicing mask. In one embodiment, the wafer is partially etched to a desired depth in the wafer. For example, the plasma etches the BEOL dielectric and partially the wafer below to the desired depth. In one embodiment, the desired depth is about the top of a subsequently formed modified region. The plasma process, in one embodiment, employs deposition and etch cycles. The plasma process forms scalloped die sidewalls 618. Each cycle of deposition and etch forms 1 scalloped sub-portion. However, since the passivation serves as a dicing mask, it is not affected by the plasma etch.

Figure 6D:
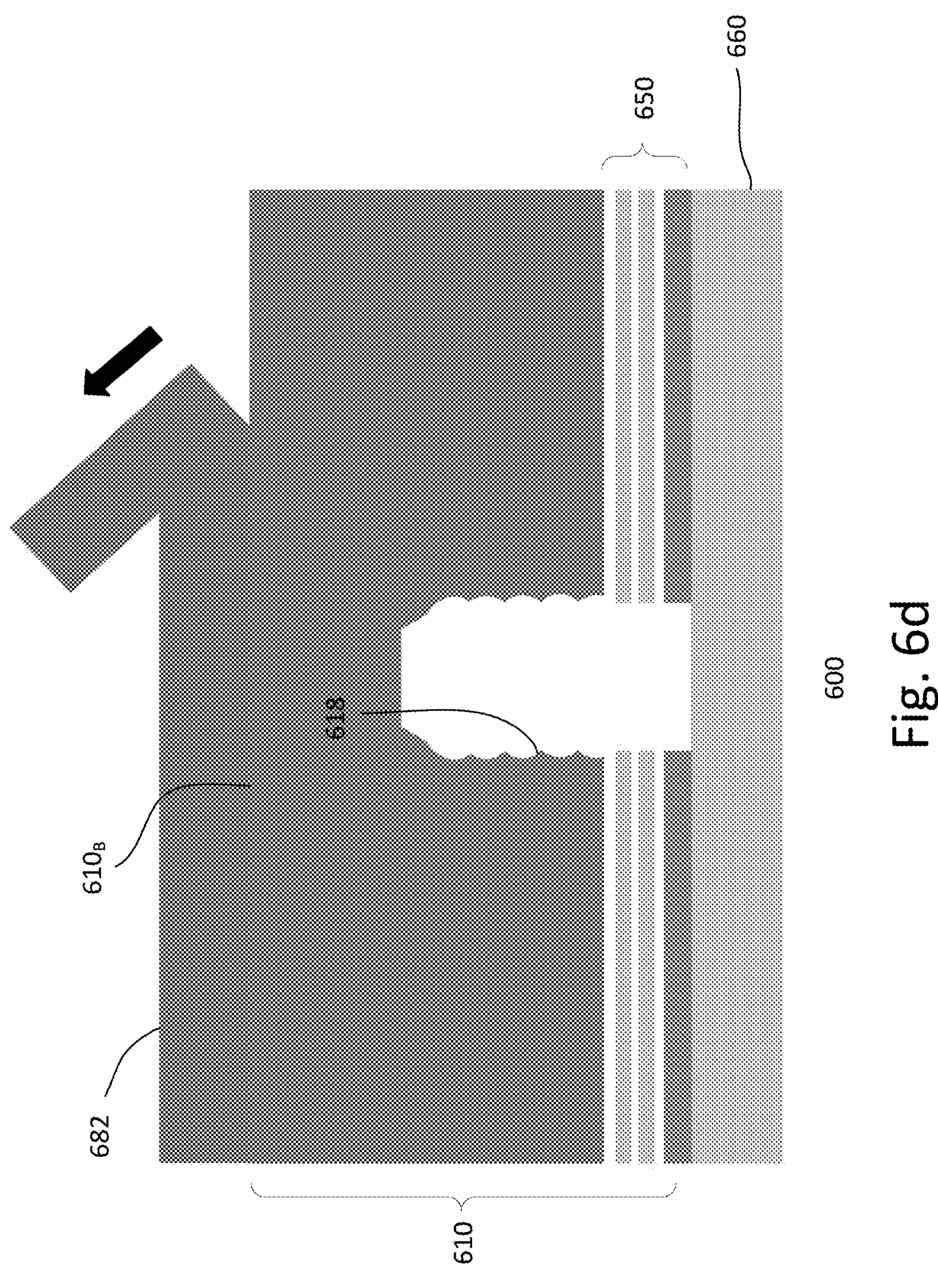

In FIG. 6*d*, a BG tape 660 is attached to the processed wafer. For example, the BG tape is attached to the surface of the passivation stack. The dicing tape 682 is removed from the inactive surface $\mathbf{610}_B$ of the wafer. This leaves the inactive surface of the wafer exposed. In some embodiments, the inactive surface of the wafer may be ground to thin the processed wafer to the desired thickness. Alternatively, no grinding of the wafer is performed.

Figure 6E:
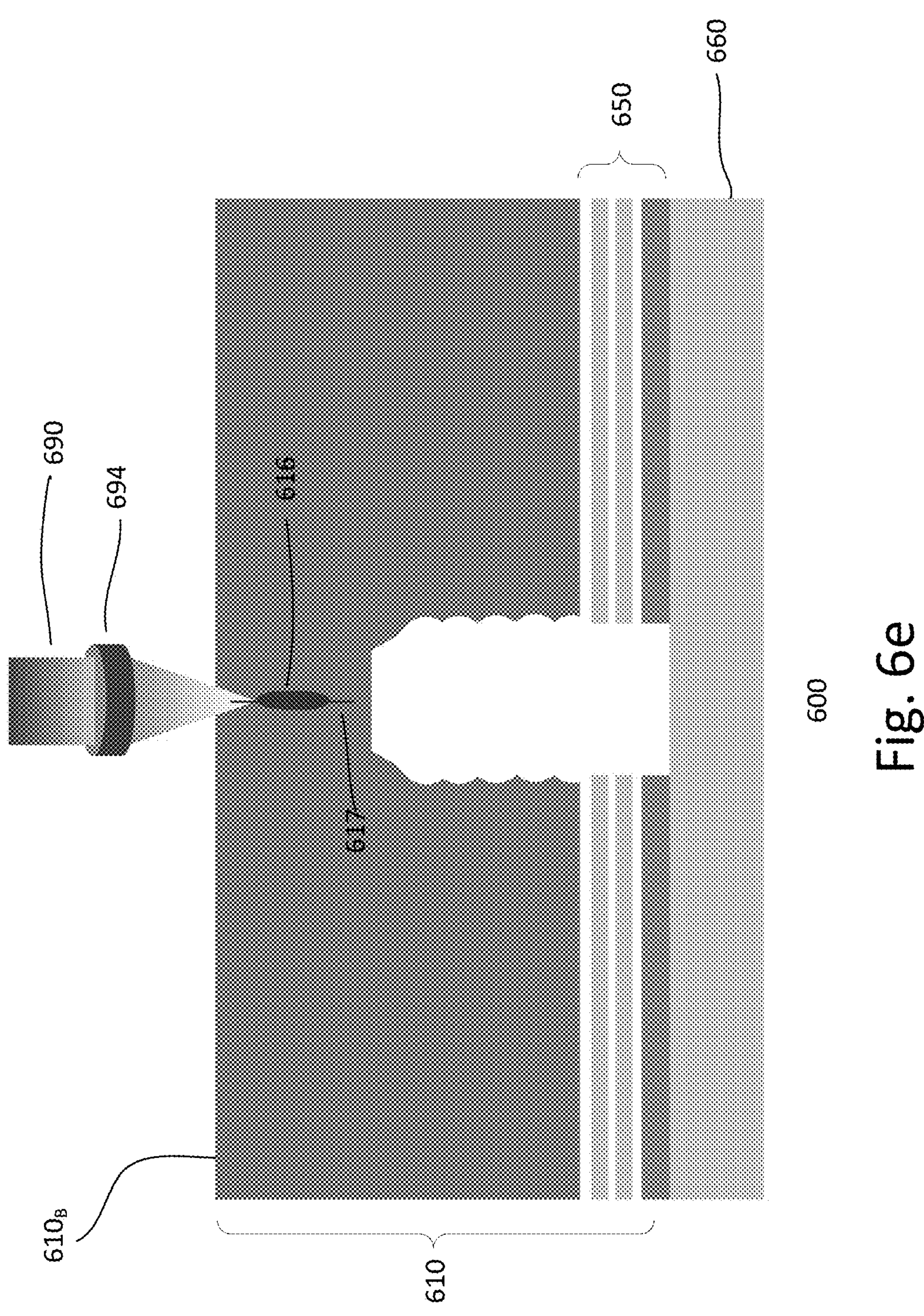

Referring to FIG. 6*e*, stealth dicing is performed. In one embodiment, a laser beam 690 from a laser is employed for stealth dicing. The laser beam is focused through a lens 694. The laser beam penetrates the inactive wafer surface $\mathbf{610}_B$. The laser is focused to a desired depth to form a modified layer 616 with cracks 617 in the dicing channels of the wafer. For example, the modified layer is disposed in the remaining portion of the partially diced wafer.

Figure 6F:
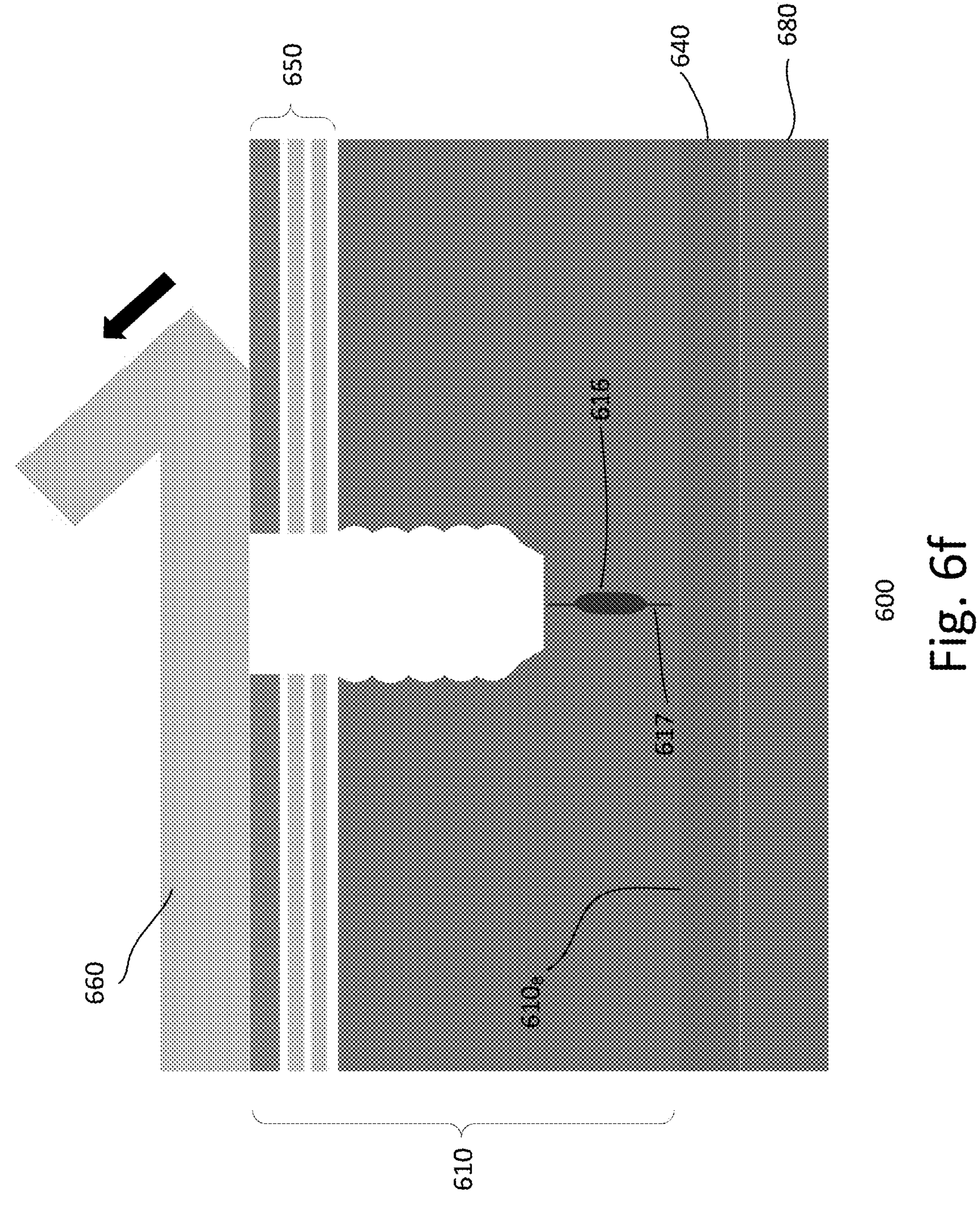

Referring to FIG. 6*f*, a DAF 640 is attached to the bottom surface $\mathbf{610}_B$ of the wafer 610. The bottom surface of the wafer may be a ground surface. Alternatively, the bottom surface is unground. The processed wafer is mounted onto a wafer dicing tape 680. For example, the wafer dicing tape is on the wafer film frame. As shown, the DAF is attached to the wafer dicing tape. The BG tape 660 is then removed. The process continues as described in, for example, FIGS. 4*f*-4*g*.

Figure 7A:
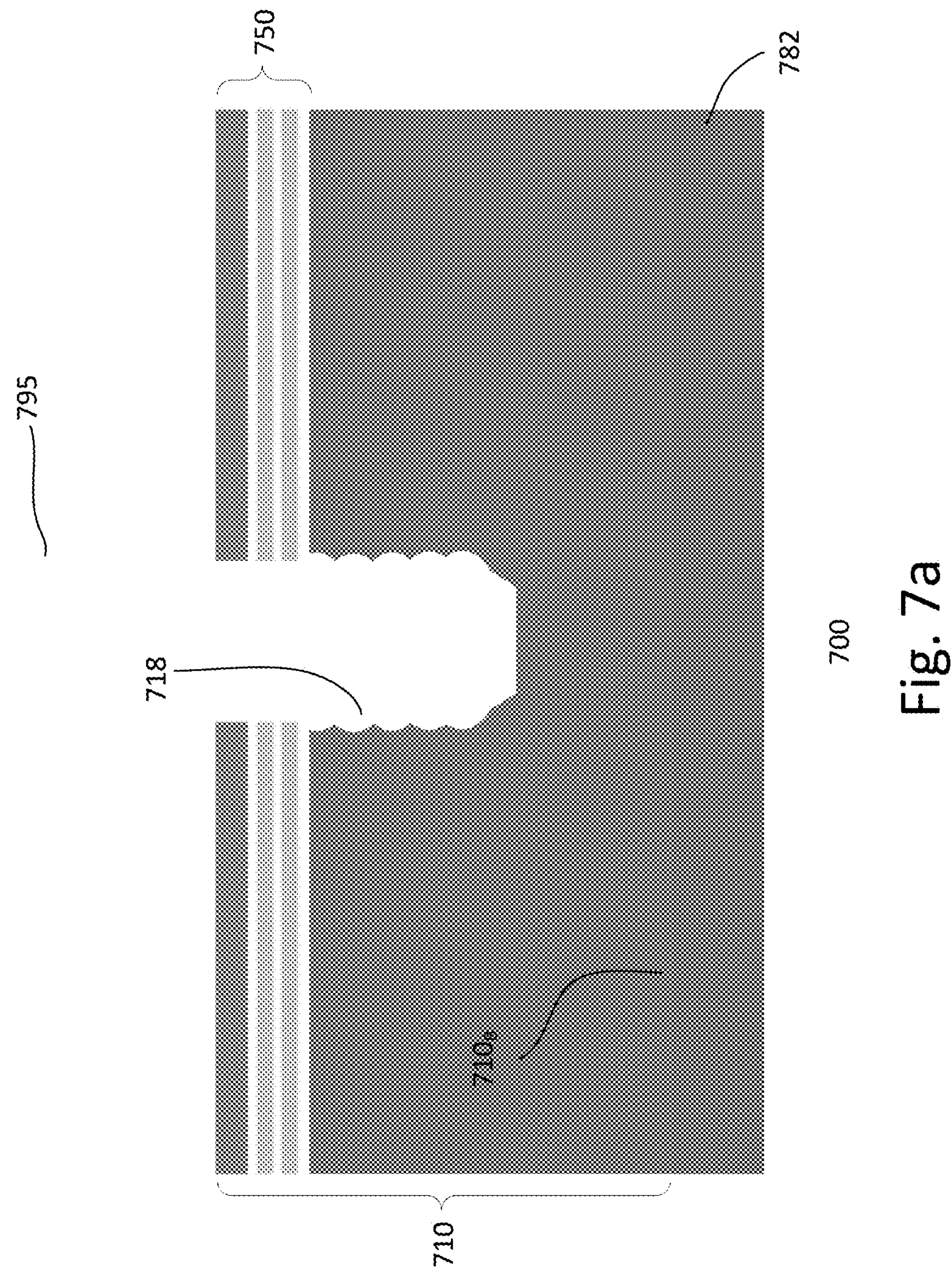
FIGS. 7*a*-7*d* show simplified cross-sectional views depicting another process for plasma dicing a wafer.
Figure 7B:
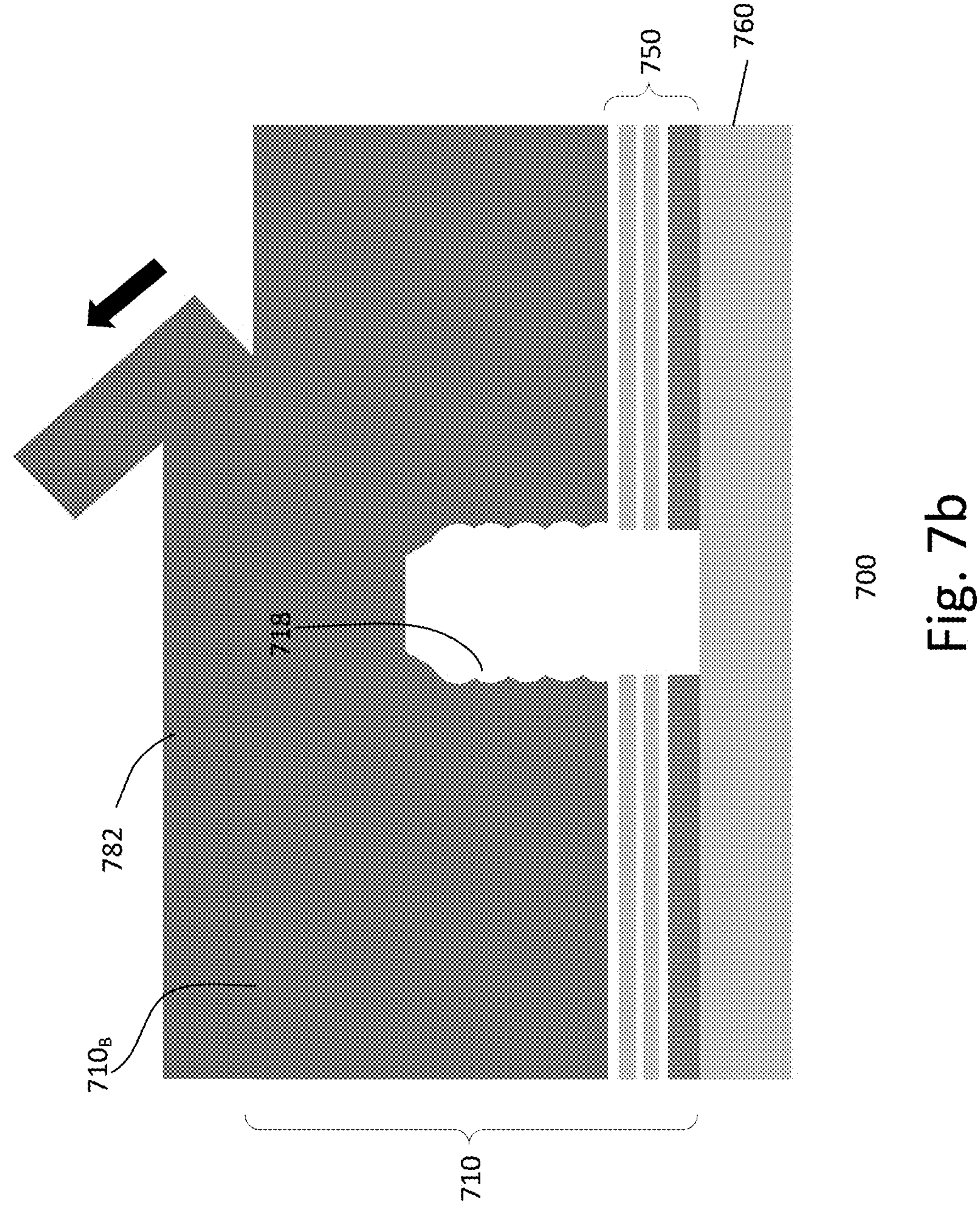
Figure 7C:
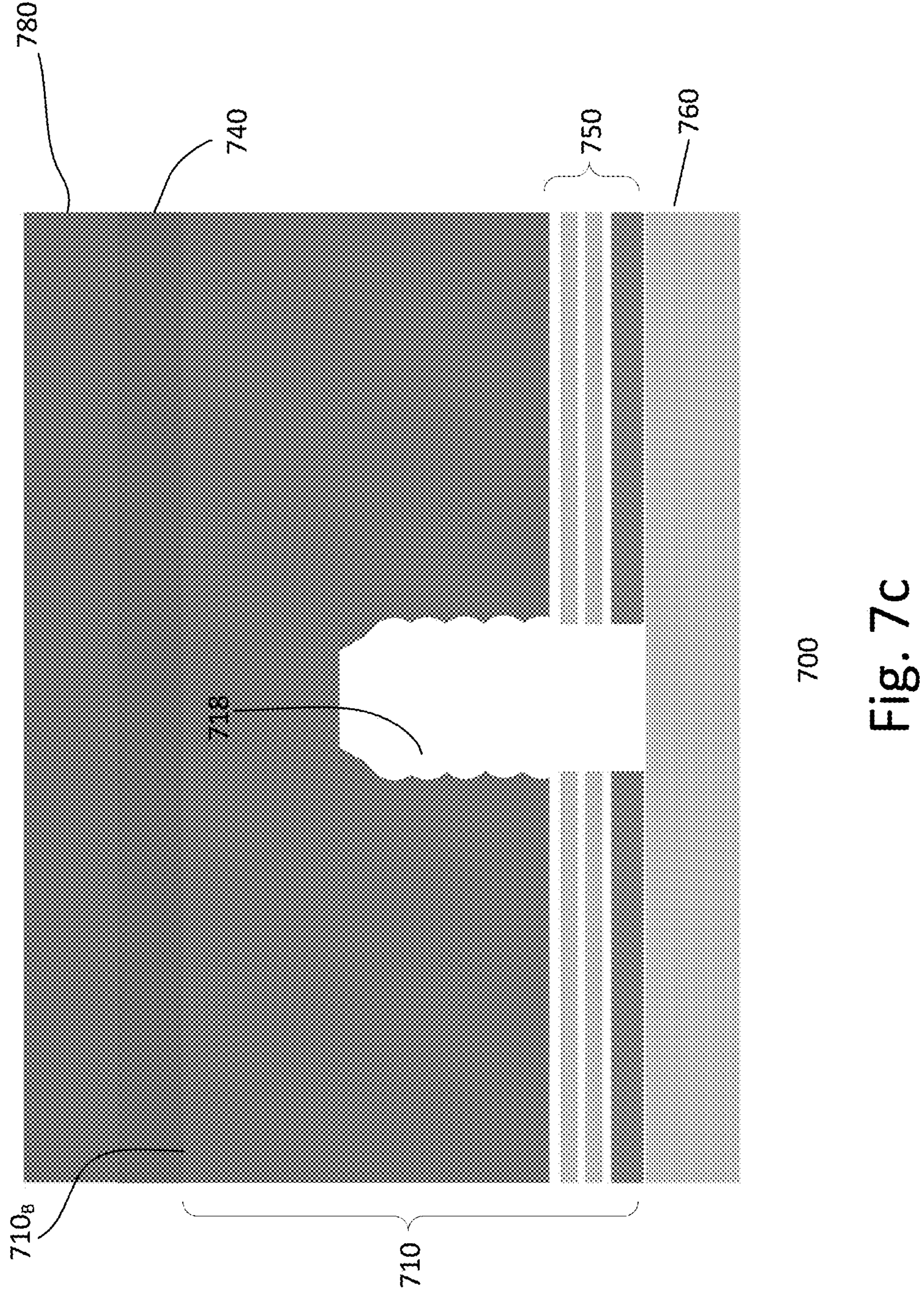

FIGS. 7*a*-7*c* show simplified cross-sectional views of a portion of another embodiment of a process 700 for plasma dicing a processed wafer to singulate it into individual dies. Illustratively, a portion of the wafer is shown. The processed wafer and portion of the wafer are similar to that shown in FIGS. 1*a*-1*b* and the dies are similar to the die described in FIG. 2. The portion of the process is similar to that described in FIG. 3*e*. For example, the process forms the modified layer through the dicing tape and the DAF after partial plasma dicing. Furthermore, the process includes similar processing to those described in FIGS. 4*a*-4*g*, FIGS. 5*a*-*c* and FIGS. 6*a*-6*f* Common elements may not be described or described in detail.

Referring to FIG. 7*a*, the portion of a processed wafer 710 is shown which includes two adjacent dies with a saw street and a kerf region therein. The processed wafer is at the stage of processing as described in FIG. 6*c*. For example, the processed wafer is mounted onto a wafer dicing tape 782 of a wafer film frame and partially plasma diced using a patterned passivation stack 750. The plasma dicing forms scalloped sidewalls 718.

In FIG. 7*b*, a BG tape 760 is attached to the processed wafer. For example, the BG tape is attached to the surface of the passivation stack. The dicing tape 782 is removed from the inactive surface $\mathbf{710}_B$ of the wafer. This leaves the inactive surface of the wafer exposed. In some embodiments, the inactive surface of the wafer may be ground to thin the processed wafer to the desired thickness. Alternatively, no grinding of the wafer is performed.

Referring to FIG. 7*c*, a DAF 740 is attached to the bottom surface $\mathbf{710}_B$ of the wafer 710. The bottom surface of the wafer may be a ground surface. Alternatively, the bottom surface is unground. The processed wafer is mounted onto a wafer dicing tape 780. For example, the wafer dicing tape is on the wafer film frame. As shown, the DAF is attached to the wafer dicing tape.

Figure 7D:
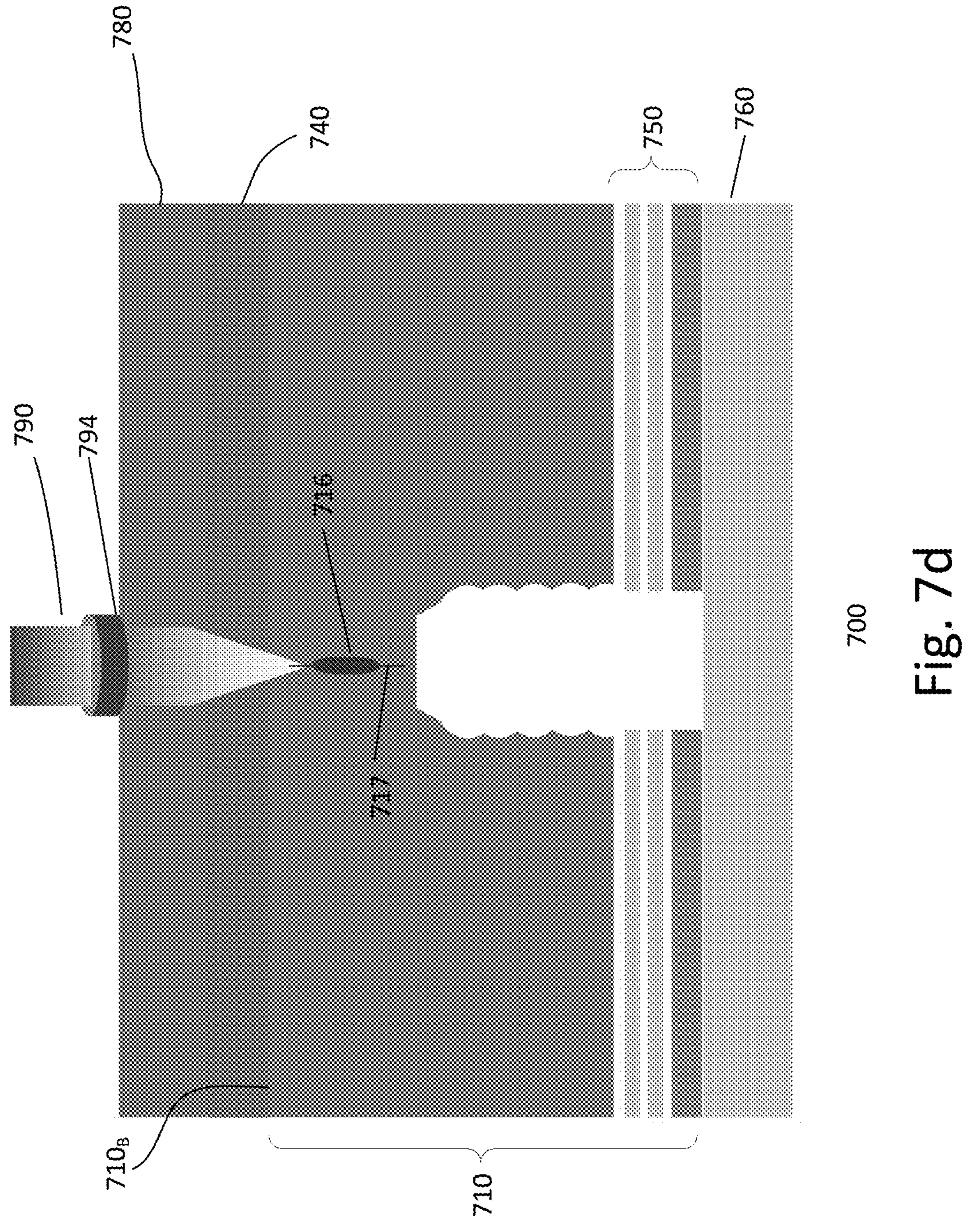

In FIG. 7*d*, stealth dicing is performed. In one embodiment, a laser beam 790 from a laser is employed for stealth dicing. The laser beam is focused through a lens 794. The laser beam penetrates the dicing tape, DAF and through inactive wafer surface $\mathbf{710}_B$. The laser is focused to a desired depth to form a modified layer 716 with cracks 717 in the dicing channels of the wafer. For example, the modified layer is disposed in the remaining portion of the partially diced wafer.

The process continues as described in, for example, FIG. 6*f*. This, for example, includes removing the BG tape, transferring the wafer film frame with the partially diced wafer having a modified layer to a tape expansion tool and expanding the dicing tape to singulate the wafer into individual dies.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

The invention claimed is:

1. A method of forming devices comprising:

providing a processed wafer comprising a plurality of dies formed thereon, wherein the processed wafer comprises a wafer with active and inactive major wafer surfaces, wherein the active wafer includes circuit components of the devices, a BEOL (back-end-of-line) dielectric disposed on the active major wafer surface with the circuit components, the BEOL dielectric includes interconnects interconnecting the circuit components, a passivation layer disposed on a top surface of the BEOL dielectric, and dicing channels separating the plurality of dies in x and y directions;

attaching a die attach film (DAF) on the inactive major wafer surface of the wafer;

attaching a backgrinding (BG) tape to a top surface of the passivation layer stealth dicing the wafer to form a modified layer with cracks in the dicing channels in a lower portion from the inactive major wafer surface of the wafer;

mounting the processed wafer with a dicing tape on a wafer frame assembly;

removing the BG tape after stealth dicing the wafer;

patterning the passivation layer to form a patterned passivation layer, the patterned passivation layer exposes the dicing channels of the processed wafer;

plasma dicing partially the processed wafer using the patterned passivation layer as a plasma dicing mask, wherein the plasma dicing removes exposed dicing channels of the processed wafer until it reaches the lower portion of the wafer, leaving the lower portion of the wafer and the DAF remaining; and performing a singulation process using lateral force to break the lower portion of the wafer and the DAF to singulate the processed wafer into individual devices, wherein the modified layer facilitates in singulating the processed wafer.

2. The method of claim 1 wherein plasma dicing partially the processed wafer is performed after stealth dicing, and comprises attaching the backgrinding (BG) tape to the top surface of the passivation layer; and optionally backgrinding the inactive surface of the wafer to a desired thickness.

3. The method of claim 2 comprises:

stealth dicing the wafer to form the modified layer from the inactive major wafer surface of the wafer;

attaching the DAF on the inactive major wafer surface of the wafer;

mounting the processed wafer with the dicing tape on the wafer frame assembly; and removing the BG tape after stealth dicing the wafer.

4. The method of claim 3 comprises:

patterning the passivation layer;

plasma dicing partially the processed wafer using the patterned passivation layer as a plasma dicing mask; and performing the singulation process using lateral force to break the lower portion of the wafer and the DAF to singulate the processed wafer into individual devices.

5. The method of claim 2 comprises:

attaching the DAF on the inactive major wafer surface of the wafer;

mounting the processed wafer with the dicing tape on the wafer frame assembly;

stealth dicing the wafer through the DAF and the dicing tape to form the modified layer from the inactive major wafer surface of the wafer.

6. The method of claim 5 comprises:

removing the BG tape after stealth dicing the wafer;

patterning the passivation layer to form the patterned passivation layer, the patterned passivation layer exposes the dicing channels of the processed wafer;

plasma dicing partially the processed wafer using the patterned passivation layer as a plasma dicing mask; and performing the singulation process using lateral force to break the lower portion of the wafer and the DAF to singulate the processed wafer into individual devices.

7. The method of claim 1 wherein plasma dicing partially the processed wafer is performed prior to stealth dicing, and comprises:

mounting the processed wafer with the dicing tape on the wafer frame assembly;

patterning the passivation layer to form the patterned passivation layer; and plasma dicing partially the processed wafer using the patterned passivation layer as a plasma dicing mask.

8. The method of claim 7 comprises:

attaching the backgrinding (BG) tape to the top surface of the patterned passivation layer;

optionally backgrinding the inactive major wafer surface of the wafer to a desired thickness; and removing the processed wafer from the dicing tape.

9. The method of claim 8 comprises:

stealth dicing the wafer to form the modified layer with cracks in the lower portion of the wafer from the inactive major wafer surface of the wafer;

removing the BG tape from the processed wafer; and performing the singulation process using lateral force to break the lower portion of the wafer and the DAF to singulate the processed wafer into individual devices.

10. The method of claim 7 comprises:

attaching the backgrinding (BG) tape to the top surface of the patterned passivation layer;

optionally backgrinding the inactive major wafer surface of the wafer to a desired thickness;

removing the processed wafer from the dicing tape;

attaching the DAF on the inactive major wafer surface of the wafer;

mounting the processed wafer with the dicing tape on the wafer frame assembly;

stealth dicing the wafer through the DAF and dicing tape to form the modified layer from the inactive major wafer surface of the wafer;

removing the BG tape from the processed wafer, and performing the singulation process using lateral force to break the lower portion of the wafer and the DAF to singulate the processed wafer into individual devices.

11. The method of claim 4 wherein plasma dicing partially the processed wafer forms mask openings in the passivation stack with flat or chamfered sidewalls.

12. The method of claim 11 wherein plasma dicing partially the processed wafer forms scalloped die sidewalls.

13. The method of claim 6 wherein plasma dicing partially the processed wafer forms mask openings in the passivation stack with chamfered sidewalls.

14. The method of claim 13 wherein plasma dicing partially the processed wafer forms scalloped die sidewalls.

15. The method of claim 7 wherein plasma dicing partially the processed wafer forms mask openings in the passivation stack with chamfered sidewalls.

16. The method of claim 15 wherein plasma dicing partially the processed wafer forms scalloped die sidewalls.

* * * * *